(12) United States Patent
Wang et al.

(10) Patent No.: US 11,379,342 B2
(45) Date of Patent: *Jul. 5, 2022

(54) CACHE MONITORING

(71) Applicant: Intel Corporation, Santa Clara, CA (US)

(72) Inventors: Ren Wang, Portland, OR (US); Bin Li, Portland, OR (US); Andrew J. Herdrich, Hillsboro, OR (US); Tsung-Yuan C. Tai, Portland, OR (US); Ramakrishna Huggahalli, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 52 days.

This patent is subject to a terminal disclaimer.

(21) Appl. No.: 16/827,410

(22) Filed: Mar. 23, 2020

(65) Prior Publication Data
US 2020/0218631 A1 Jul. 9, 2020

Related U.S. Application Data

(63) Continuation of application No. 16/022,543, filed on Jun. 28, 2018, now Pat. No. 10,599,548.

(51) Int. Cl.
*G06F 11/30* (2006.01)
*G06F 11/34* (2006.01)
(Continued)

(52) U.S. Cl.
CPC ...... *G06F 11/3466* (2013.01); *G06F 11/3037* (2013.01); *G06F 11/3089* (2013.01);
(Continued)

(58) Field of Classification Search
CPC ............... G06F 11/3466; G06F 12/128; G06F 12/0888; G06F 12/084; G06F 12/0811; G06F 13/4282; G06F 11/3037; G06F 11/3089; G06F 12/121; G06F 13/1668; G06F 2212/1024; G06F 2212/154;
(Continued)

(56) References Cited

U.S. PATENT DOCUMENTS 8,924,692 B2 12/2014 Knauth et al.
9,053,029 B2 6/2015 Roy et al.
(Continued)

OTHER PUBLICATIONS

Vanini, E., et al., "Let it Flow: Resilient Asymmetric Load Balancing with Flowlet Switching," Proceedings of the 14th USENIX Symposium on Networked Systems Design and Implementation (NSDI '17), Mar. 27-29, 2017, Boston, MA; pp. 407-420 (15 pages).

(Continued)

*Primary Examiner* — Tasnima Matin
(74) *Attorney, Agent, or Firm* — Compass IP Law PC

(57) ABSTRACT

There is disclosed in one example a computing apparatus, including: a processor; a multilevel cache including a plurality of cache levels; a peripheral device configured to write data directly to a selected cache level; and a cache monitoring circuit, including a cache counter to track cache lines evicted from the selected cache level without being processed; and logic to provide a direct write policy according to the cache counter.

21 Claims, 15 Drawing Sheets

(51) Int. Cl.
  *G06F 12/0811* (2016.01)
  *G06F 12/121* (2016.01)
  *G06F 13/16* (2006.01)
  *G06F 13/42* (2006.01)
  *G06F 12/128* (2016.01)
  *G06F 12/084* (2016.01)
  *G06F 12/0888* (2016.01)
  *H04L 67/1097* (2022.01)
  *G06F 13/28* (2006.01)

(52) U.S. Cl.
  CPC ........ *G06F 11/3409* (2013.01); *G06F 12/084* (2013.01); *G06F 12/0811* (2013.01); *G06F 12/0888* (2013.01); *G06F 12/121* (2013.01); *G06F 12/128* (2013.01); *G06F 13/1668* (2013.01); *G06F 13/4282* (2013.01); *G06F 13/28* (2013.01); *G06F 2201/88* (2013.01); *G06F 2201/885* (2013.01); *G06F 2212/1016* (2013.01); *G06F 2212/1024* (2013.01); *G06F 2212/154* (2013.01); *G06F 2212/502* (2013.01); *G06F 2213/0026* (2013.01); *H04L 67/1097* (2013.01)

(58) Field of Classification Search
  CPC .............. G06F 2212/502; G06F 13/28; G06F 2212/1016; G06F 2213/0026; H04L 67/10
  See application file for complete search history.

(56) References Cited

U.S. PATENT DOCUMENTS

| 9,092,253 | B2 | 7/2015 | Taillefer et al. |
| 2014/0173221 | A1 | 6/2014 | Samih et al. |
| 2014/0281740 | A1* | 9/2014 | Casado ............... G06F 11/3471 714/47.2 |
| 2015/0234745 | A1* | 8/2015 | Roy .................... G06F 12/0862 711/125 |
| 2017/0085442 | A1* | 3/2017 | Dinan ..................... H04L 47/10 |
| 2017/0091090 | A1* | 3/2017 | Wang .................. G06F 12/0808 |
| 2018/0052630 | A1 | 2/2018 | Peng et al. |
| 2019/0042388 | A1 | 2/2019 | Wang et al. |
| 2019/0102303 | A1* | 4/2019 | Wang .................. G06F 12/0831 |

OTHER PUBLICATIONS

European Office Action for Patent Application No. 19175814.3, dated Nov. 4, 2021, 7 pages.

Notice of Allowance for U.S. Appl. No. 16/022,543, dated Nov. 18, 2019, 8 pages.

Office Action for U.S. Appl. No. 16/022,543, dated Jul. 25, 2019, 6 pages.

* cited by examiner

US 11,379,342 B2

CACHE MONITORING

CROSS REFERENCE TO RELATED APPLICATION

This Application is a continuation of (and claims benefit of priority from, under 35 U.S.C. § 120) U.S. application Ser. No. 16/022,543, filed Jun. 28, 2018, entitled "CACHE MONITORING." The disclosure of each prior application is considered part of (and is incorporated by reference in) the disclosure of this application.

FIELD OF THE SPECIFICATION

This disclosure relates in general to the field of enterprise computing, and more particularly, though not exclusively, to a system and method for providing cache monitoring.

BACKGROUND

In some modern data centers, the function of a device or appliance may not be tied to a specific, fixed hardware configuration. Rather, processing, memory, storage, and accelerator functions may in some cases be aggregated from different locations to form a virtual "composite node." A contemporary network may include a data center hosting a large number of generic hardware server devices, contained in a server rack for example, and controlled by a hypervisor. Each hardware device may run one or more instances of a virtual device, such as a workload server or virtual desktop.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

EMBODIMENTS OF THE DISCLOSURE

Figure 1:
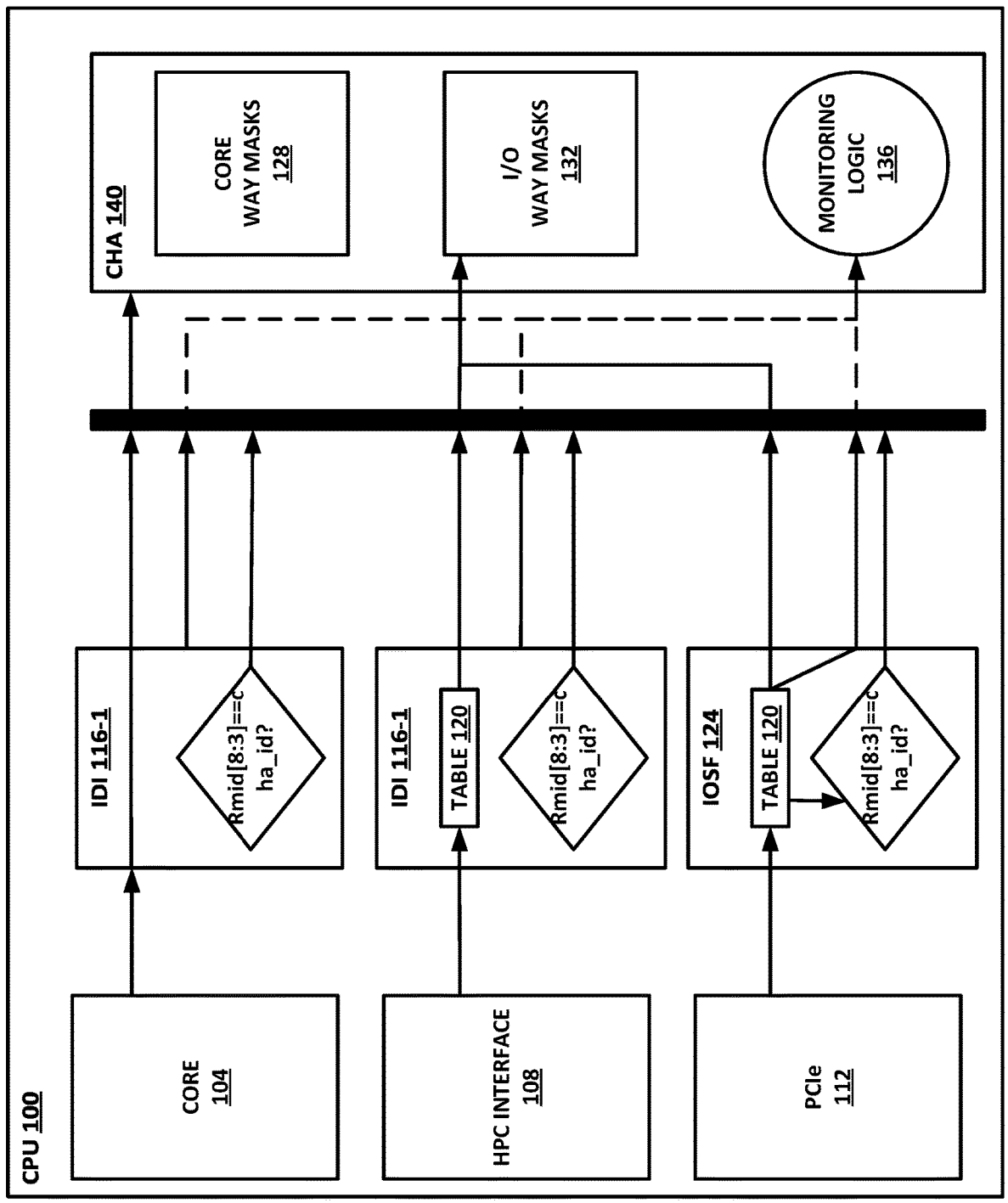
FIG. 1 is a block diagram of a central processing unit (CPU) with shared resource monitoring capabilities, according to one or more examples of the present specification.

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed. Different embodiments may have different advantages, and no particular advantage is necessarily required of any embodiment.

Modern enterprise computing can include, among other things, servers, appliances, virtual machines, containers, and other distributed or non-distributed computing systems. In such a computing environment, operators may require visibility into and control over shared resources such as last-level cache (LLC) and memory bandwidth. To provide those operators with the required visibility into those shared resources, an enterprise CPU may provide a shared resource monitor (SRM), such as Intel® Resource Director Technology (RDT). In embodiments of the present specification, a CPU cache is provided as a form of computer data storage that allows recently used information to be accessed efficiently at a later time. The cache may contain, for example, frequently-used instruction, predicted instructions, recently used data, or predicted data, by way of nonlimiting example.

Data Direct I/O (DDIO) is an I/O protocol that enables a device such as a peripheral device (e.g., a network interface card (NIC)) to deliver data directly into a cache level such as the LLC without having to first visit main memory, such as may occur in a direct memory access (DMA) model. With DDIO, the processor cache (rather than a system's main memory) becomes the primary source and destination of I/O data. This improves I/O data processing efficiency for data delivery and data consumption by the CPU from I/O devices.

As used in the present specification, a NIC is a computer hardware component that enables a computer to communicatively connect with a network. A NIC may be used in both wired and wireless computing embodiments, and is provided as an add-in card that fits into an expansion slot of a computer motherboard. NICS are also known, by way of nonlimiting example, as network interface controller cards, network adapter cards, expansion cards, LAN cards, and circuit boards.

In an example, a device such as an Ethernet NIC may send data directly to the processor LLC using DDIO, allocating cache lines into "I/O ways," which are a number of special LLC ways reserved specifically for I/O traffic. This helps to reduce access latency and improve performance and energy.

In another embodiment, other network fabric technologies may be used. For example, an embodiment may provide a host fabric interface (HFI) for a high performance computing (HPC) fabric such as Intel® Omni-Path. Such HPC fabrics may provide cache coherent memory operations between different cores or processors. Like a NIC, an HFI may also employ DDIO to write data directly into the LLC. In the case of an HFI, the cache operation may be a "write update": the line is updated in the LLC if the line is found in cache, but written to system memory if the line is not found in the LLC. Other embodiments of HPC fabrics may provide an HFI that uses a PCIe interface. Current versions of PCIe are non-cache-coherent, so the behavior of these fabrics may be similar to the Ethernet NIC (e.g., always writing to dedicated IO ways).

Both the Ethernet and the HPC approach can encounter issues if, for example, cache is oversubscribed or undersubscribed. In the case of an Ethernet NIC, when the I/O incoming rate is faster than the CPU consumption rate, data may be evicted from memory before the CPU consumes it. Not only does this nullify the benefit of DDIO, but it actually reduces CPU performance because of the unnecessary LLC cache evictions, whereas without using DDIO, the data could have simply been written directly to memory via DMA. These unnecessary cache evictions can also increase the hardware platform's power consumption, because of the additional block movements to bring the data back after they have been evicted from cache.

In the case of an HPC fabric, the HFI may only perform write update, meaning that for new data arriving that are not found in the cache, even if the cache is undersubscribed, the data may be written back to system memory and later brought into cache by the CPU. This can cause unnecessary memory trips with negative performance and energy impacts. In the case of an HFI using a PCIe interface, conditions are similar to those faced in the case of Ethernet.

Issues can arise, especially in the case of a non-inclusive cache. A strictly inclusive cache is one in which all levels of cache are correlated, such that a datum found, for example, in L1 cache must always be found in L2 and L3 caches. A non-inclusive cache is one in which data in lower levels of cache may or may not be found in upper levels of cache. For example, data may be brought down into lower levels of cache so that they can be consumed by the CPU, and may be removed from the upper levels of cache, where they are no longer needed. But in the case of a non-inclusive cache, a write-update DDIO peripheral sees only that the cache line is not in the LLC. It does not know whether the data have been evicted by the LLC (e.g., because the processor is bogged down and cannot keep up with IO operations), or because the data have already been consumed by the core (e.g., because the processor is running well ahead of the IO operations).

Better performance can be realized when LLC utilization is monitored and data for all I/O devices are allocated into LLC when there is space (e.g., when the processor is keeping in front of IO operations), and written to memory when there is insufficient space (e.g., when the CPU is unable to keep up with incoming I/O). Embodiments of the present specification provide an SRM such as Intel® RDT, including a cache monitor with counters La, Lp, and Le. Although these three counters do not give a DDIO peripheral direct visibility into why a cache line is no longer in the LLC (or some other level of cache such as L2 or L1), they can be used in the aggregate to inform a meaningful direct write policy, enabling the DDIO device to know whether the CPU is keeping up (so that data should be DDIOed into LLC) or falling behind (so that data should be DMAed into main memory).

The cache monitor of the present specification monitors the use of I/O ways in an LLC, including in a non-inclusive cache. This can advantageously provide a unified architecture for adaptive DDIO for Ethernet, HPC fabrics, other peripherals, and even software threads.

Some existing cache monitors include a single LLC occupancy counter per thread, with each counter associated with a resource monitoring ID (RMID). The RMID enables independent and simultaneous monitoring of a plurality of concurrently running threads on a multicore processor. A per-thread architectural model specific register (MSR) allows each hardware thread to be associated with an RMID. The MSR may include, for example, a class of service (CLOS) field used for control over resource allocation, along with an RMID field. The RMID may represent a software thread or an I/O thread. While the examples of the present specification discuss specifically the use of RMIDs for I/O threads, it should be noted that the cache monitoring capabilities disclosed herein may be used for all cases including software thread RMIDs, to give a better indication of cache utilization to better serve applications.

The LLC occupancy counter available in some existing cache monitors is configured to monitor LLC behavior for a small number of sample sets of all available LLC sets. Empirically, it has been found that the behavior of the cache is sufficiently random that sampling a small number of sets is sufficient to create a representative sample of all cache transactions. For example, a cache may include hundreds or thousands of individual sets, and the occupancy counter or counters may sample some small number of those, such as 2%.

The counter is incremented (e.g., increased by 1) when a line is filled in LLC, and decremented (e.g., decreased by 1) when a line disappears from LLC. This does not take into consideration, however, where that line goes to. For example, the line could be pulled to mid-level cache (MLC) or L1 cache so that the data can be consumed by a core, or the line could be evicted to system memory. In an inclusive cache, there would be no possible confusion, because even if a line is fetched by the CPU, it still exists in the LLC and the counter does not change. The counter only decreases when a line is evicted to memory.

But in a non-inclusive cache, a single LLC occupancy counter may not be able to provide a full picture of cache occupancy. This can be especially true in the context of providing adaptive DDIO, where an intelligent policy directive indicates whether data are to be direct written to cache, or written to main memory via DMA. In the case of DDIO, if many lines are evicted from LLC before they are processed by the core, this implies that the LLC is crowded and new lines should not be allocated into the LLC. On the other hand, if many lines are pulled to MLC/L2 cache by the core for processing, the LLC is freed up and new lines should be allocated into the LLC. But single LLC occupancy counters may be unable to differentiate between these two situations, which in fact represent opposite phenomena. In the former case, data are being evicted because the LLC is oversubscribed, while in the latter case data are being consumed by the CPU and the LLC is undersubscribed.

To provide a more accurate picture of cache utilization, the cache monitor of the present specification provides three separate counters, namely La, Lp, and Le, per RMID. These three counters better capture LLC utilization, particularly in the case of DDIO transactions, but more generally in any data transaction. As with existing LLC counters, the counters disclosed herein may also operate on a small subset of all cache lines represented as a sample set. For example, it has been empirically determined that a small sampling such as 2% of all sets in the cache is sufficient to represent the overall cache behavior.

Counter La represents that a cache line has been allocated. La is incremented when there is a cache line allocated into LLC.

Counter Lp is represents that a cache line has been processed by the CPU. Lp is incremented each time a cache line is processed by the CPU and deallocated from LLC—representing a situation where the data have not been evicted from LLC, but rather have already been consumed, and are therefore no longer necessary.

Counter Le represents that a cache line has been evicted from LLC. Le is incremented when there is a cache line untouched by the CPU that is evicted from LLC to system memory—representing a situation where the CPU is not able to keep up with IO operations.

During a particular time window i, which may be a small time window, these three counters can be used to describe cache dynamics. If the CPU is fast enough to process all incoming I/O packets during window i, Lp should be approximately equal to La, while Le should be very small or close to 0. On the other hand, if the I/O is too fast to the point of overwhelming the CPU's processing ability, Le will be relatively significant, while Lp will be smaller than La.

Because these counters may be applied to only a small sample of transactions (i.e., those occurring on the selected sets), in some embodiments those cache lines that are sampled are always allocated into the LLC. These samplings can then be used to determine a direct write policy for the RMID. Cache operations that hit other cache sets are handled according to the direct write policy for window i. For example, at a window i−1, it may be determined that the LLC is undersubscribed. So a direct write policy is set for window i to DDIO new cache lines into cache. But if samples taken during window i indicate that the LLC is now oversubscribed, then a new direct write policy is set for window i+1 to DMA new data to main memory. This allows the CPU to catch up with the I/O. After each window, counters La, Lp, and Le may be reset for the next policy window.

The length of a window i is a parameter that may be configured. For example, 100 samples on the selected sets may constitute a measuring window, with all counters reset at the start of the next window. For each window i, the processing rate and eviction rate for the window may be calculated:

$$RP(i)=Lp(i)/La(i)$$

$$RE(i)=Le(i)/La(i)$$

The processing rate and eviction rate reflect the instantaneous cache utilization (cache, I/O, and CPU interaction in the window i). A high RP indicates most incoming packets can effectively be processed by the core, which is a desirable property. A high RE indicates that a significant portion of incoming packets are evicted before being processed by the core, which is generally considered an undesirable behavior. In the case that RE is high, new incoming packets should be written directly to system memory to avoid cache line bouncing, which causes degraded performance and consumes unnecessary energy. Embodiments of the present specification employ a low-cost exponential weighted moving average (EWMA) filter on the rate samples to smooth out oscillations and noise and obtain the cache behavior trend. By way of example, the EWMA may behave as below:

$$RP(\text{new})=(1-a)*RP(\text{old})+a*RP(i)$$

$$RE(\text{new})=(1-b)*RE(\text{old})+b*RE(i)$$

Weight parameters a and b indicate how agilely the current rate would respond to the newest sample from window i. The larger the weight given to the new sample, the greater agility that the average weight responds to changes, but it is also more prone to be impacted by noise. These parameters can be adjusted experimentally in various embodiments according to the implementation details.

A system and method for cache monitoring will now be described with more particular reference to the attached FIGURES. It should be noted that throughout the FIGURES, certain reference numerals may be repeated to indicate that a particular device or block is wholly or substantially consistent across the FIGURES. This is not, however, intended to imply any particular relationship between the various embodiments disclosed. In certain examples, a genus of elements may be referred to by a particular reference numeral ("widget 10"), while individual species or examples of the genus may be referred to by a hyphenated numeral ("first specific widget 10-1" and "second specific widget 10-2").

A contemporary computing platform, such as a hardware platform provided by Intel® or similar, may include a capability for monitoring device performance and making decisions about resource provisioning. For example, in a large data center such as may be provided by a cloud service provider (CSP), the hardware platform may include rack-mounted servers with compute resources such as processors, memory, storage pools, accelerators, and other similar resources. As used herein, "cloud computing" includes network-connected computing resources and technology that enables ubiquitous (often worldwide) access to data, resources, and/or technology. Cloud resources are generally characterized by great flexibility to dynamically assign resources according to current workloads and needs. This can be accomplished, for example, via virtualization, wherein resources such as hardware, storage, and networks are provided to a virtual machine (VM) via a software abstraction layer, and/or containerization, wherein instances of network functions are provided in "containers" that are separated from one another, but that share underlying operating system, memory, and driver resources.

As used herein, a processor includes any programmable logic device with an instruction set. Processors may be real or virtualized, local or remote, or in any other configuration. A processor may include, by way of nonlimiting example, an Intel® processor (e.g., Xeon®, Core™, Pentium®, Atom®, Celeron®, x86, or others). A processor may also include competing processors, such as AMD (e.g., Kx-series x86 workalikes, or Athlon, Opteron, or Epyc-series Xeon workalikes), ARM processors, or IBM PowerPC and Power ISA processors, to name just a few.

In embodiments of the present disclosure, a VM is an isolated partition within a computing device that allows usage of an operating system and other applications, independent of other programs on the device in which it is contained. VMs, containers, and similar may be generically referred to as "guest" systems.

Figure 7:
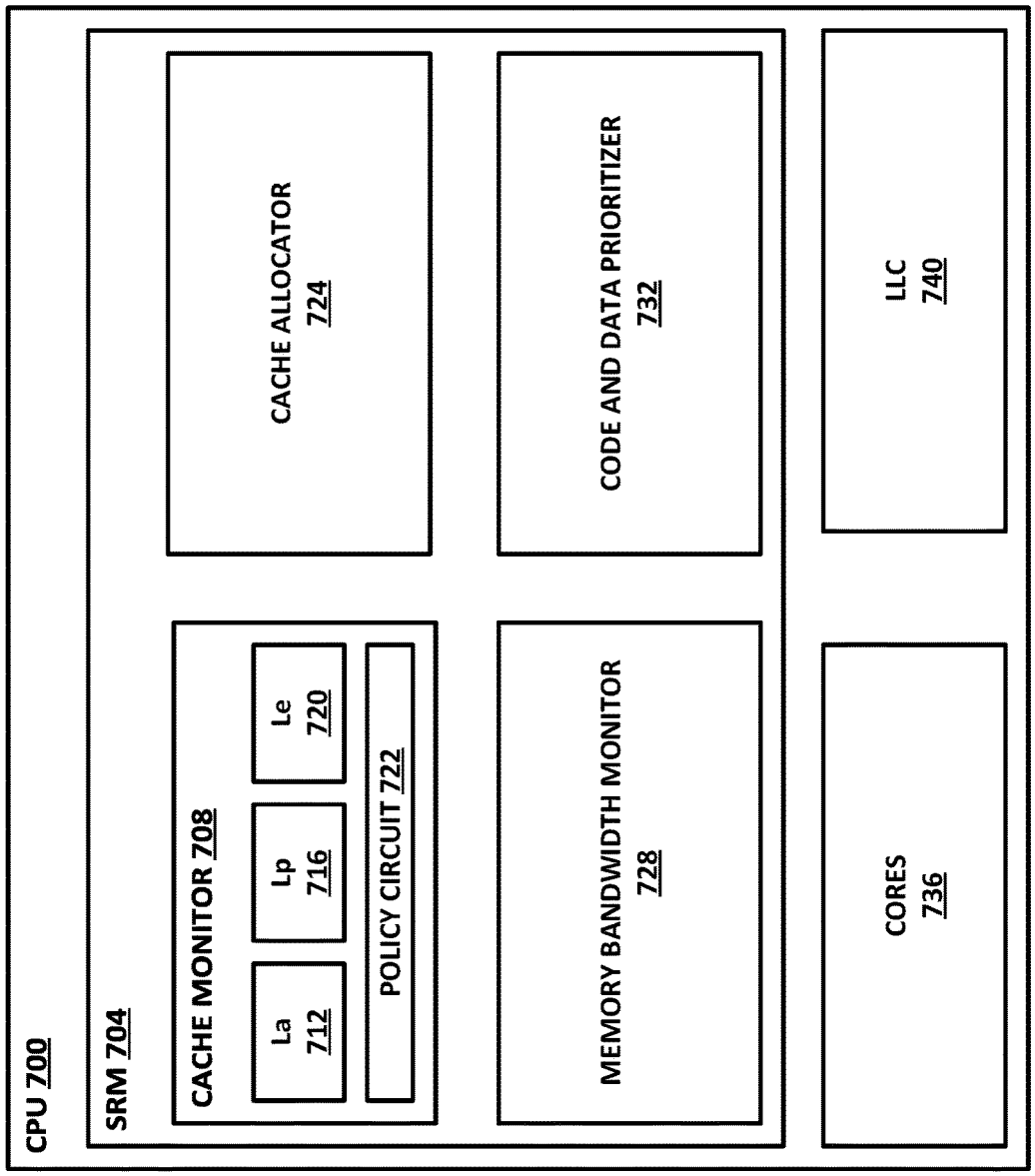
FIG. 7 is a block diagram of selected elements of a CPU, according to one or more examples of the present specification.

FIG. 1 is a block diagram of a CPU 100 with shared resource monitoring capabilities, according to one or more examples of the present specification. In this case, CPU 100 includes a caching home agent (CHA) 140, which controls access to the cache. CHA 140 includes core way masks 128 and I/O way masks 132, which may be used respectively to mask cache ways allocated for general purpose core usage and cache ways that are allocated specifically for I/O usage. CHA 140 also includes monitoring logic 136, which may be part of a shared resource monitor (e.g., a cache monitor of an SRM as illustrated in FIG. 7).

Core 104 accesses CHA 140 via in-die interconnect (IDI) 116, or other similar interconnect technologies. IDI 116 extracts the RMID from the access request, and may provide the RMID to monitoring logic 136, which can use the RMID to apply a direct write policy, according to the teachings of the present specification. The actual data are directed to core way masks 128 (or alternately, to main memory, depending on the current direct write policy).

In the case of HPC link 108 and PCIe 112, the access requests are routed to I/O way masks 132. As with IDI 116-1, IDI 116-2 includes circuitry to extract the RMID from the access requests, which RMID may be provided to monitoring logic 132. Table 120 may be populated with policy data that instructs IDI 116, and may additionally store policy directives for accessing I/O way masks 132. As in the case of IDI 116-1, the RMID and an RMID valid bit may be extracted from the transaction and provided to monitoring logic 136. The actual data are provided to I/O way masks 132 (or alternately, written directly to memory).

In the case of PCIe 112, Intel® on-chip system fabric (IOSF) 124 (or a similar fabric) receives the DDIO request, and extracts the RMID, as in the case of IDIs 116. The RMID is provided to monitoring logic 136 for policy determination while the access request is provided to I/O way masks 132.

FIG. 1 illustrates that cache monitoring can be used to monitor LLC utilization for I/O ways. In some existing systems, a single RMID is assigned to I/O, and this RMID may be used to monitor LLC utilization of I/O. As discussed above, certain existing systems use a single LLC occupancy counter for each RMID, with the occupancy counter monitoring the LLC behavior for a small number of sample sets. The counter is incremented when a line is filled in to LLC with the associated RMID, and decremented when a line is ousted from LLC.

This single counter works well for traditional inclusive cache hierarchies where the LLC is inclusive of MLC and L1. But with a non-inclusive cache, when a line disappears from LLC, the counter does not differentiate between the line being fetched to MLC by the CPU or evicted to system memory. In the former case, the line still exists in cache, while it does not in the latter case. This is a limitation of a single LLC occupancy counter that limits its effectiveness in the case of DDIO. While the LLC occupancy counter can be used to provide a direct write policy, wherein DDIO may be adaptively enabled under certain conditions (sending all packets to the LLC) or disabled (sending all packets to memory), the method is more useful when differentiation is made between CPU consumption and cache eviction.

This is because the existing LLC occupancy counter monitors only cache occupancy in the LLC, but not in the entire cache hierarchy. Monitoring cache occupancy in the LLC alone is sufficient in cases of an inclusive cache, where LLC occupancy correctly reflects occupancy throughout the cache hierarchy. But in the case of a non-inclusive cache hierarchy, the single counter has limited usability. A line could be brought into MLC by the CPU for processing, which is actually desirable behavior for the DDIO, meaning that the LLC may actually be undersubscribed. But an LLC occupancy counter gives the impression that the line has been evicted and that the LLC is actually oversubscribed, and thus lacks sufficient capacity for incoming I/O data. In systems based on a single LLC occupancy counter, DDIO may be either turned on or off in a coarse-grained fashion, without considering fine-grained behavioral models for the overall non-inclusive cache.

To more effectively utilize DDIO, all lines may be installed into LLC if there is sufficient space for the faster processing. In a best case scenario, all lines installed into the LLC I/O partition are processed by the CPU before they are evicted from the cache. Some existing I/O systems, such as Ethernet and HPC fabrics over PCIe always install data into the LLC via DDIO. In other cases, such as non-PCIe HPC fabrics, the DDIO performs only write update.

Either of these scenarios can be suboptimal in cases where the cache is underutilized or over-utilized. Advantageously, the shared resource monitor of the present specification, including the cache monitor with three LLC occupancy counters, provides a unified DDIO architecture for all I/O devices that intelligently directs incoming data to the LLC when there is space, and writes data to memory when the LLC is oversubscribed. This avoids eviction before processing.

In order to achieve this result, the shared resource monitor (SRM) of the present specification extends the existing LLC monitoring capabilities to differentiate cases when a line is evicted from memory from cases where a line is processed by the CPU. Note that in a non-inclusive cache hierarchy, in either of these cases the line disappears from the LLC, even though they essentially represent opposite results (i.e., that the CPU is oversubscribed in the former case, or undersubscribed in the latter case). The SRM of the present specification provides a unified I/O architecture that achieves high performance, reduces memory bandwidth and energy consumption significantly, and thus reduces latency in computing operations.

Figure 2:
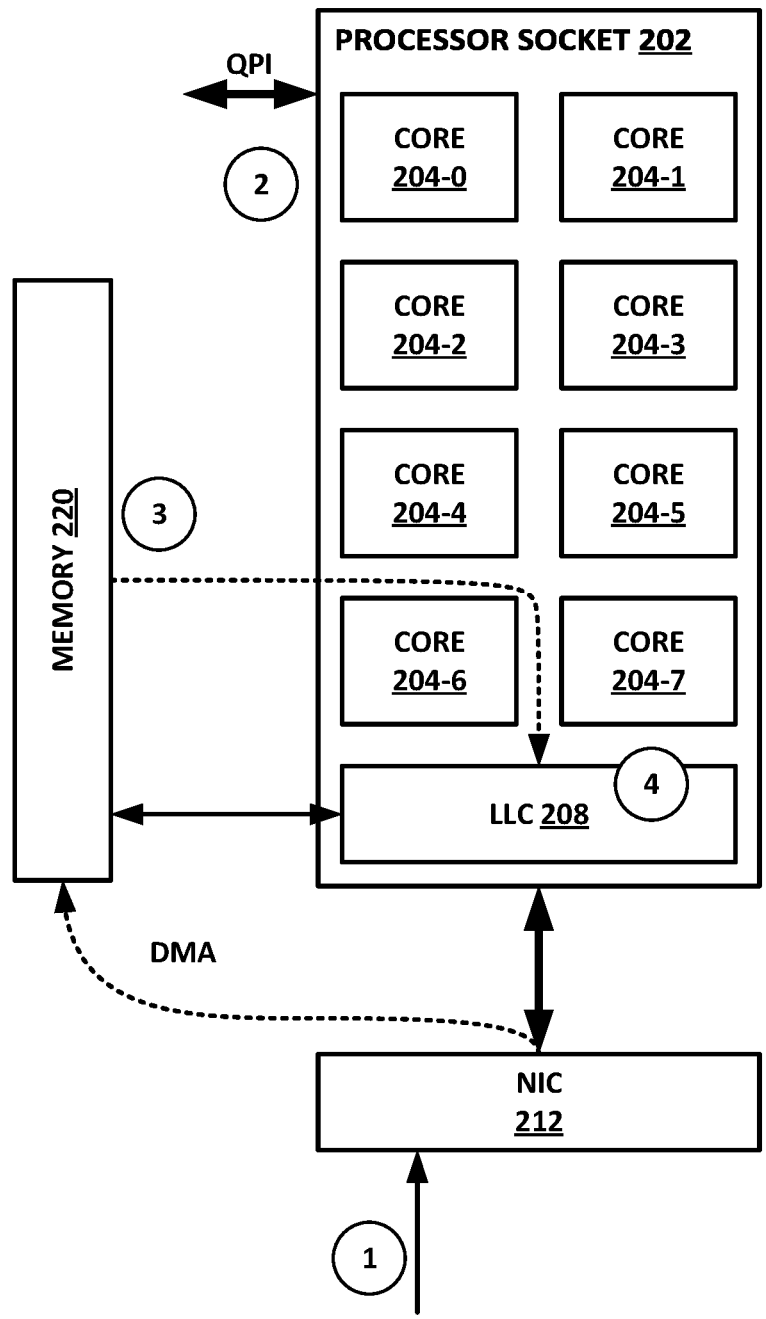
FIG. 2 is a block diagram of a system illustrating a memory transaction that does not use device direct input/output (DDIO), according to one or more examples of the present specification.

FIG. 2 is a block diagram of a system illustrating a memory transaction that does not use DDIO, according to one or more examples of the present specification.

In the example of FIG. 2, a processor socket 202 includes eight cores, namely core 204-0, core 204-1, core 204-2, core 204-3, core 204-4, core 204-5, core 204-6, and core 204-7. Cores 204 share an LLC 208. Processor socket 202 may communicatively couple to other sockets within the same system via an interface such as Intel® Omni-Path or other HPC fabric.

In this case, a NIC 212 communicatively couples to processor socket 202, and the system also includes a memory 220.

In this example, NIC 212 may not be able to directly write data to LLC 208, either because the system does not support DDIO, or because LLC 208 is oversubscribed. Thus, in operation 1, NIC 212 receives an incoming packet. Because NIC 212 cannot directly write the packet to LLC 208, NIC 212 instead DMAs the data to memory 220.

At operation 2, core 204-0 needs to access and process the data from NIC 212. Thus, in operation 3, the data is written from memory 220 into LLC 208.

In operation 4, the data is fetched from LLC 208 into core 204-0. According to common computing practice, writing data into memory 220 and fetching data from memory 220 may take hundreds or thousands of clock cycles. Thus, it is advantageous to bypass memory 220 in cases where it is possible to do so.

Figure 3:
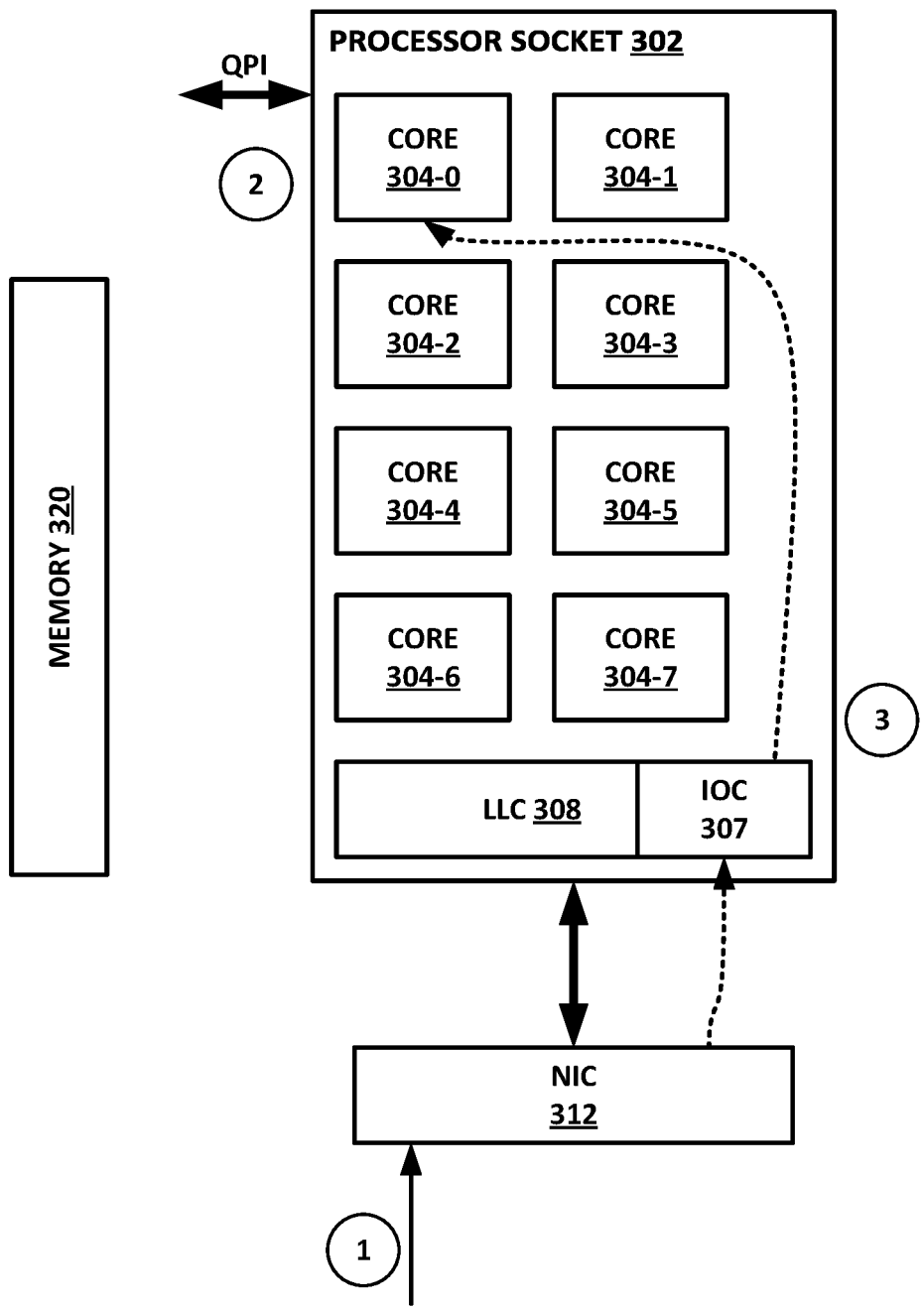
FIG. 3 is a block diagram of a memory transaction where DDIO is supported and enabled, according to one or more examples of the present specification.

FIG. 3 is a block diagram of a memory transaction where DDIO is supported and enabled, according to one or more examples of the present specification.

In the example of FIG. 3, a processor socket 302 includes eight cores, namely core 304-0, core 304-1, core 304-2, core 304-3, core 304-4, core 304-5, core 304-6, and core 304-7. Cores 304 share an LLC 308. Processor socket 302 may communicatively couple to other sockets within the same system via an interface such as Intel® Omni-Path or other HPC fabric.

In this example, at operation 1, NIC 312 receives incoming data. Because DDIO is supported and enabled, NIC 312 writes the data directly to LLC 308, for example, to an IOC region 307 of LLC 308. IOC region 307 is an I/O allocated region of LLC. This avoids trips to memory 320, and thus data can be fetched from LLC 308 on the order of tens of clock cycles versus hundreds or thousands of clock cycles in writing to and reading from memory 320. Thus, by bypassing memory 320, the performance of the memory read operation is increased by approximately an order of magnitude.

It is therefore advantageous to write data directly to LLC via DDIO when it is possible to do so without the data being evicted from LLC before the core can process the data. But in many cases, IOC 307 has a limited capacity. If the incoming data rate is faster than the CPU service rate, lines are evicted to memory 320 before they have a chance to be processed. These data then have to be brought back again for processing later. When IOC 307 is full, it is better to write data directly to memory 320 to avoid the data being evicted from cache, then brought back in when it is needed.

Figure 4:
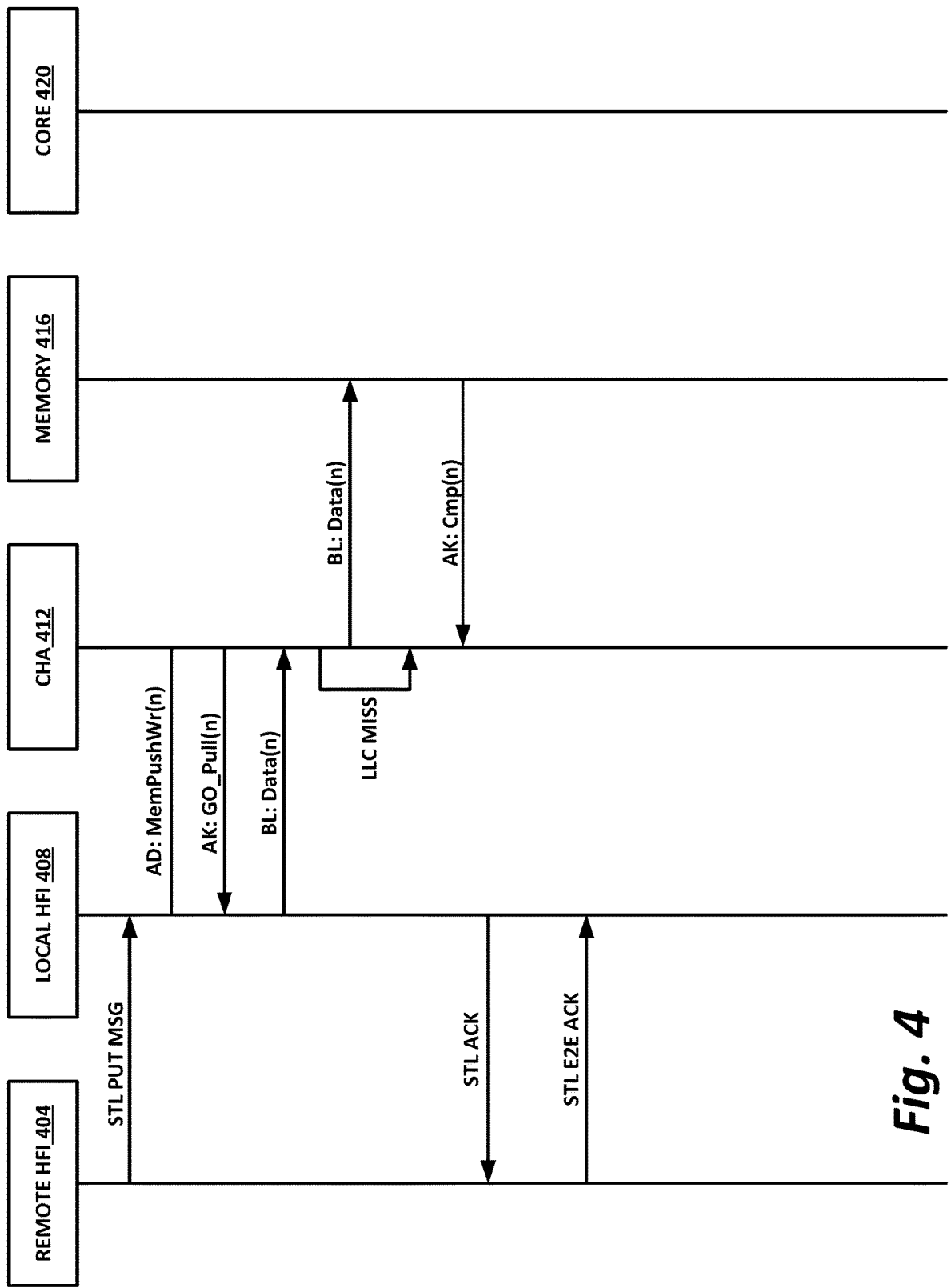
FIGS. 4 and 5 are signal flow diagrams illustrating put operations that may be used, for example, in a high performance computing fabric such as Intel® Omni-Path.
Figure 5:
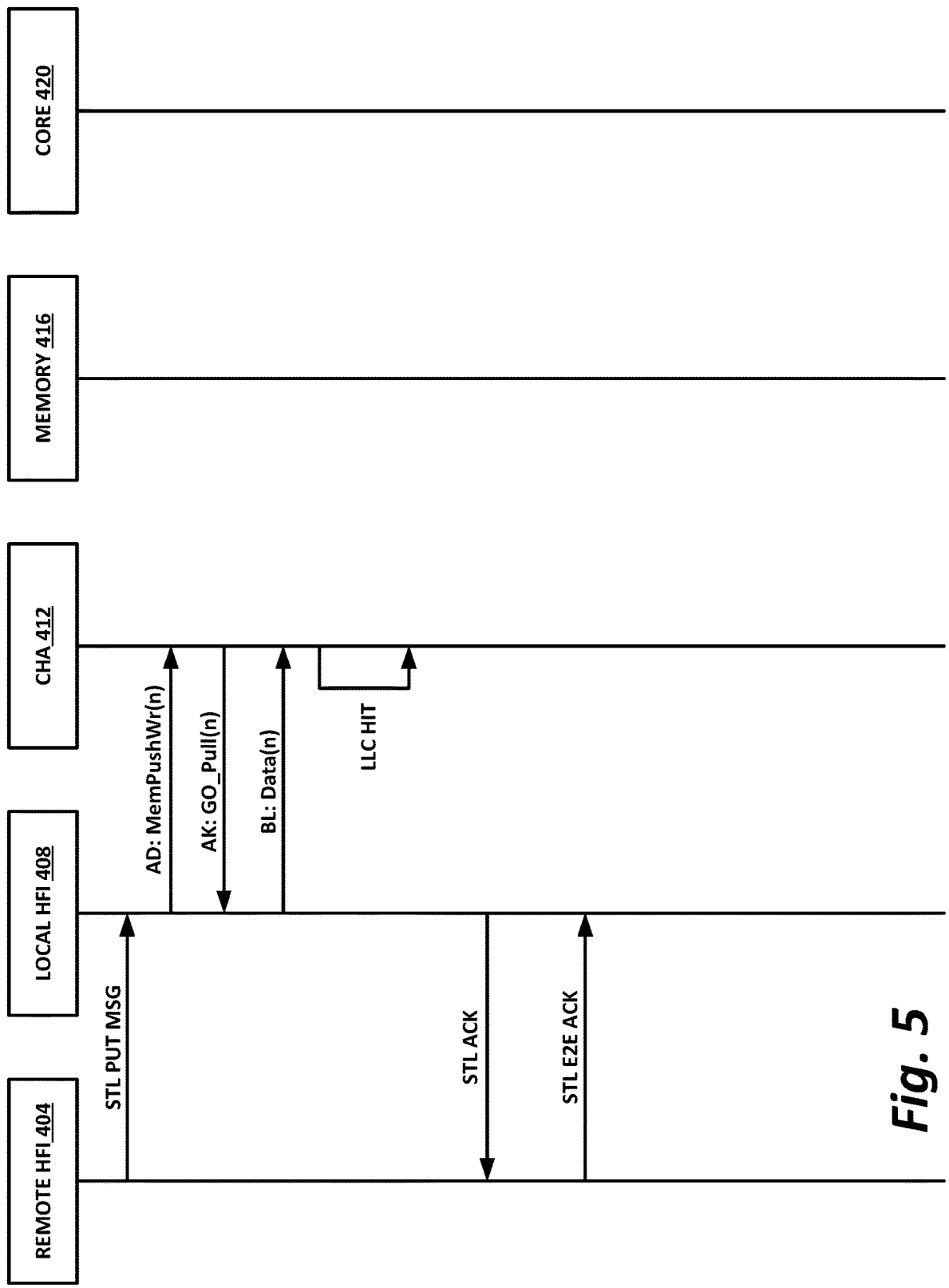

FIGS. 4 and 5 are signal flow diagrams illustrating put operations that may be used, for example, in a high performance computing fabric such as Intel® Omni-Path. As described above, these types of fabrics may use write update for DDIO. In a write update procedure, when new data are written to a cache block, the new data are broadcasted to all caches containing the same cache line. This ensures that all caches are updated with the new value for the data. Conceptually, in a fabric such as the one illustrated in FIGS. 4 and 5, when a put message is received, the CHA simply checks if the current line exists in the LLC. If it is a hit, the line is written into LLC. If it is a miss, the line is DMA'd directly to main memory, bypassing the LLC. However, as illustrated above, in the case that the IOC is undersubscribed, this is actually not desirable behavior because the data would be better allocated into the LLC as in the case of an Ethernet NIC.

Turning to FIG. 4, a remote HFI 404 first issues an Omni-Path put message to local HFI 408. Local HFI 408 then performs a memory push write operation to CHA 412. CHA 412 issues a pull to local HFI 408, and local HFI 408 then executes a block write command of the end bytes of data to CHA 412. In the example of FIG. 4, there is an LLC miss, so the block of n bytes of data is written to memory 416. Memory 416 returns an acknowledge to CHA 412.

In parallel, local HFI 408 may return an Omni-Path acknowledge to remote HFI 404, and remote HFI 404 may respond with an Omni-Path end-to-end (E2E) acknowledge.

Turning to FIG. 5, remote HFI 404 issues an Omni-Path put message to local HFI 408. Local HFI 408 issues a memory push write for n bytes of data to CHA 412. CHA 412 responds with an acknowledge to pull n bytes of data, and local HFI 408 puts a block of n bytes of data to CHA 412. In this case, there is an LLC hit, so CHA 412 writes the data directly into the LLC.

As before, local HFI 408 responds with an Omni-Path acknowledge, and remote HFI 404 responds back with an Omni-Path E2E acknowledge.

Figure 6:
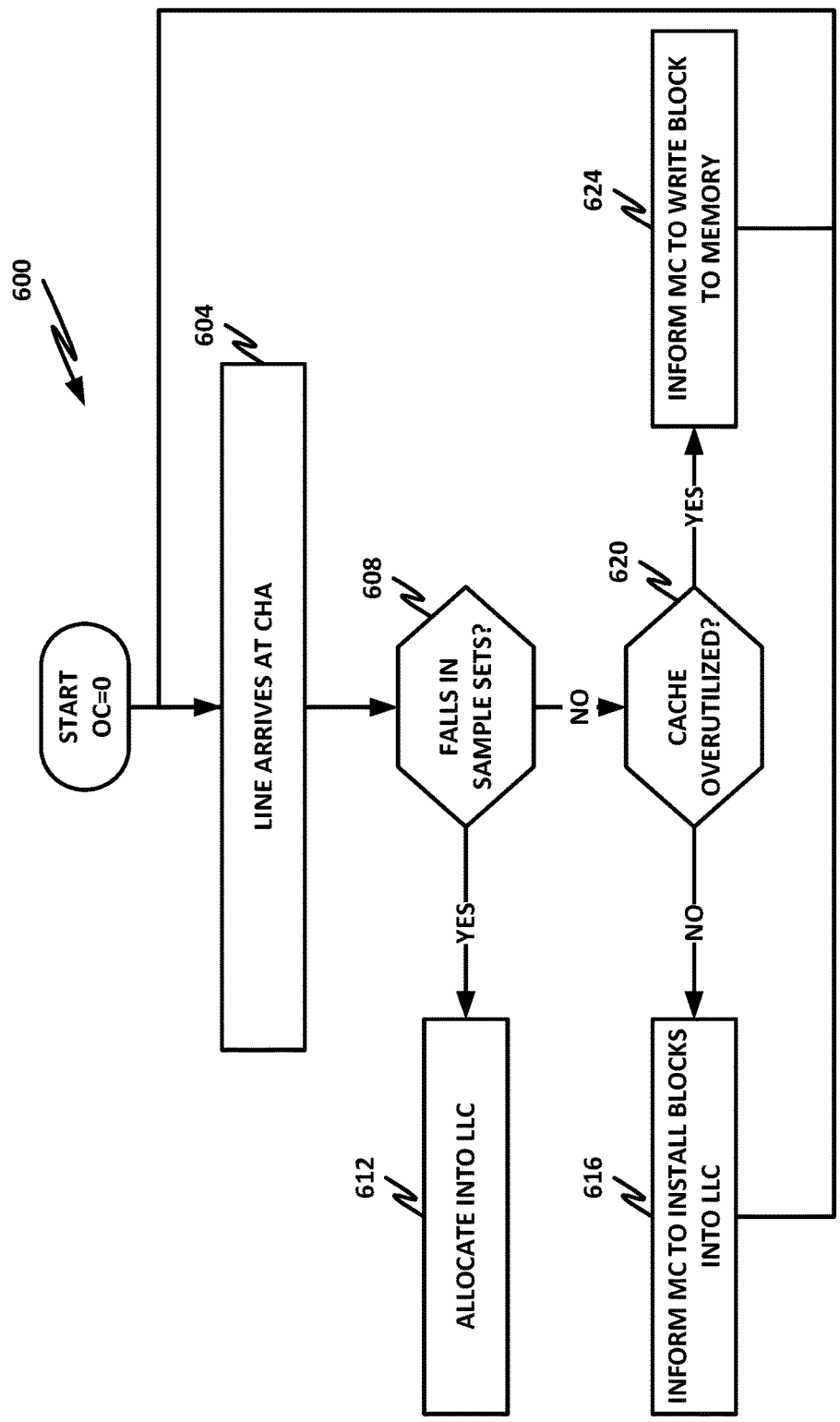
FIG. 6 is a flowchart of a method of monitoring a cache, according to one or more examples of the present specification.

FIG. 6 is a flowchart of a method 600 of monitoring a cache, according to one or more examples of the present specification. In the example of FIG. 6, at the start, all counters are initialized to 0.

At block 604, a line arrives at the CHA from an I/O device or from some other source as described throughout the specification.

In decision block 608, the CHA checks to see whether this is part of the sample set. For example, the CHA may sample approximately 2% of available sets within the cache. Those 2% of all sets are considered to be sufficiently representative of the entire cache to make a policy decision for the full cache.

If the transaction hits one of the sampled sets, then in block 612, the data are allocated directly into LLC, according to the description herein. Responsive to the transaction, counters such as La, Lp, and Le may be incremented as described herein.

If the sample does not hit one of the sampled sets, then in decision block 620, the CHA determines whether the cache is currently over-utilized (as determined by the present caching policy). This may be according to a policy set according to sampled cache transactions in the previous window. If the current policy is that the cache (or specifically the LLC) is not over-utilized, then in block 616, memory controller installs the blocks directly into the LLC according to the policy.

Returning to block 620, if the cache is currently over-utilized, then the device writes the data directly to memory. In block 624, the memory controller writes the data to memory according to the policy.

In block 698, the method is done.

FIG. 7 is a block diagram of selected elements of a CPU 700, according to one or more examples of the present specification.

In the example of FIG. 7, CPU 700 includes cores 736, LLC 740, and a shared resource monitor (SRM) 704. Shared resource monitor 704 may be, for example, an Intel® RDT circuit.

Embodiments of SRM 704 may provide, by way of nonlimiting example, a cache monitor 708 configured to provide insight into LLC or other cache level utilization by individual threads, applications, or VMs. This can improve application characterization, "noisy neighbor" detection, performance debugging, real-time provisioning, and resource scheduling.

SRM 704 may also provide a cache allocator 724, by way of nonlimiting example. Cache allocator 724 improves control by prioritizing VM's, containers, or applications through redistribution of LLC capacity. This can provide enhanced runtime determinism, as well as protection of important VMs and virtualized resources such as virtual switches, applications, or other critical resources from resource contention. This can also prevent noisy neighbor interference across priority workloads.

SRM 704 may further provide a memory bandwidth monitor 728, by way of nonlimiting example. In the example of FIG. 7, memory bandwidth monitor 728 may track a plurality of VMs or applications independently by providing memory bandwidth monitoring for each running thread simultaneously. This can provide detection of noisy neighbors that over-utilize memory bandwidth, characterization and debugging of performance for bandwidth sensitive applications, and enhanced non-uniform memory access (NUMA) aware scheduling.

SRM 704 may further provide a code and data prioritizer 732, by way of nonlimiting example. Code and data prioritizer 732 enables separate control over code and data placement in the LLC, such as in an L3 cache, for example. Some specialized types of workloads may benefit from increased runtime determinism, enabling greater predictability in application performance.

As illustrated in FIG. 7, SRM 704 may be provided as Intel® RDT, and may provide counters La 712, Lp 716, and Le 720.

Counter La 712 is used to represent that a cache line is allocated. La 712 is increased when there is a cache line allocated into LLC.

Counter Lp 716 is used to represent that a cache line is processed by the CPU. Lp 716 is incremented each time there is a cache line processed by the CPU and deallocated from LLC—representing a situation where the data have not been evicted from LLC, but rather have already been consumed, and are therefore no longer necessary.

Counter Le 720 is used to count when a cache line is evicted from LLC. Le 720 is incremented when there is a cache line untouched by the CPU that is evicted from LLC to system memory. During a particular time window, which may be a small time window, these three counters can be used to describe cache dynamics. If the CPU is fast enough to process all incoming I/O packets, Lp should be approximately equal to La, while Le should be very small or close to 0. On the other hand, if the I/O is too fast to the point of overwhelming the CPU's processing ability, Le will be relatively significant, while Lp will be smaller than La.

Figure 8:
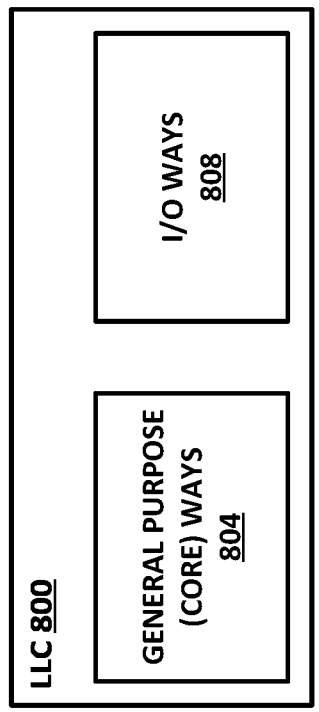
FIG. 8 is a block diagram of general purpose ways and I/O ways in a last-level cache (LLC), according to one or more examples of the present specification.

FIG. 8 is a block diagram of general purpose ways and I/O ways in an LLC, according to one or more examples of the present specification. General purpose ways 804 may be allocated for general purpose core usage, while I/O ways 808 may be allocated specifically for I/O usage. These allocations may reduce latency and improve overall system performance and energy.

Figure 9:
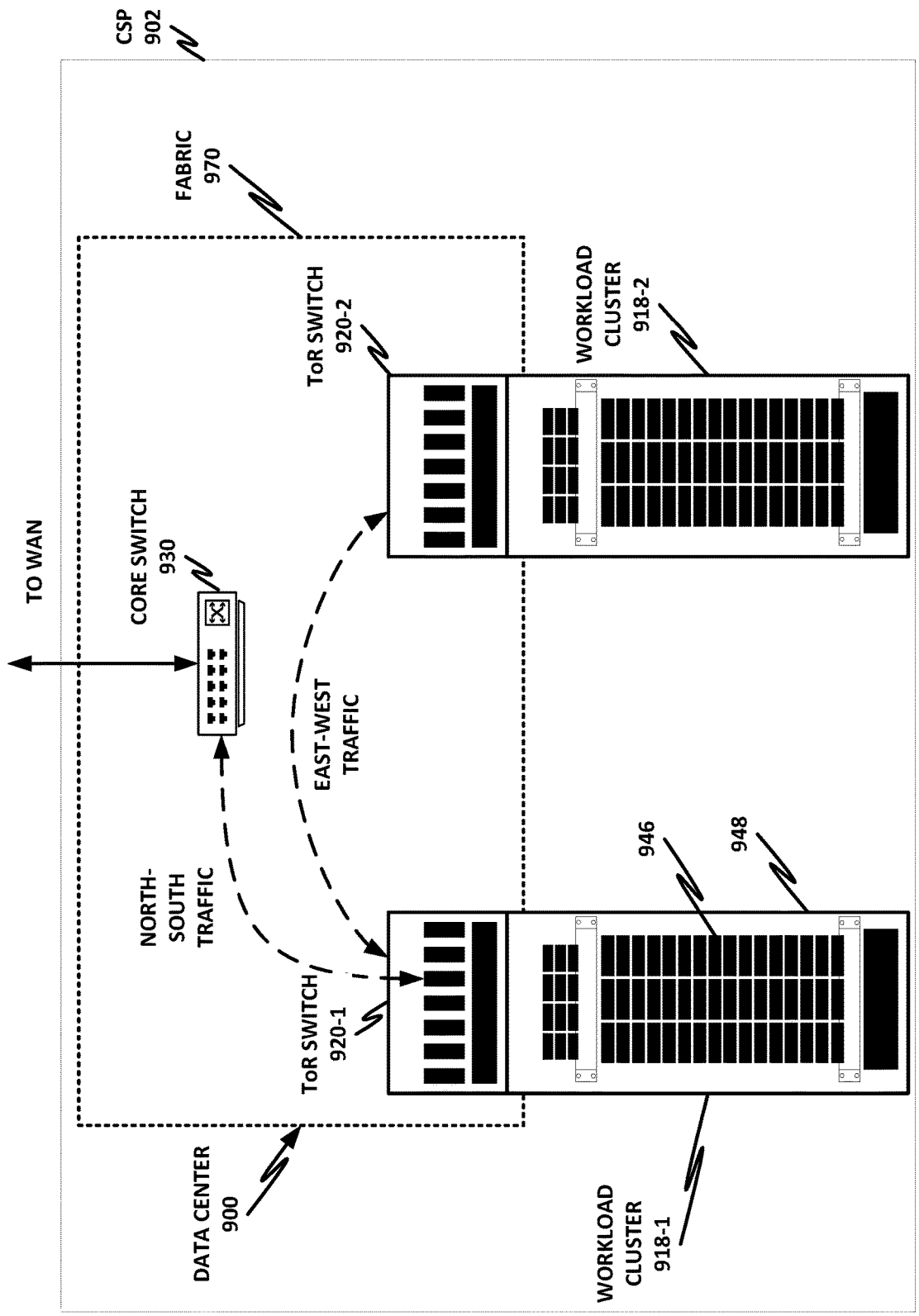
FIG. 9 is a block diagram of selected components of a data center with connectivity to a network of a cloud service provider (CSP), according to one or more examples of the present application.

FIG. 9 is a block diagram of selected components of a data center 900 with connectivity to a network of a cloud service provider (CSP) 902, according to one or more examples of the present specification. Embodiments of data center 900 disclosed herein may be adapted or configured to provide the method of cache monitoring according to the teachings of the present specification.

CSP 902 may be, by way of nonlimiting example, a traditional enterprise data center, an enterprise "private cloud," or a "public cloud," providing services such as infrastructure as a service (IaaS), platform as a service (PaaS), or software as a service (SaaS). In some cases, CSP 902 may provide, instead of or in addition to cloud services, HPC platforms or services. Indeed, while not expressly identical, HPC clusters ("supercomputers") may be structurally similar to cloud data centers, and unless and except where expressly specified, the teachings of this specification may be applied to either.

CSP 902 may provision some number of workload clusters 918, which may be clusters of individual servers, blade servers, rackmount servers, or any other suitable server topology. In this illustrative example, two workload clusters, 918-1 and 918-2 are shown, each providing rackmount servers 946 in a chassis 948.

In this illustration, workload clusters 918 are shown as modular workload clusters conforming to the rack unit ("U") standard, in which a standard rack, 19 inches wide, may be built to accommodate 42 units (42U), each 1.75 inches high and approximately 36 inches deep. In this case, compute resources such as processors, memory, storage, accelerators, and switches may fit into some multiple of rack units from one to 42.

Figure 13:
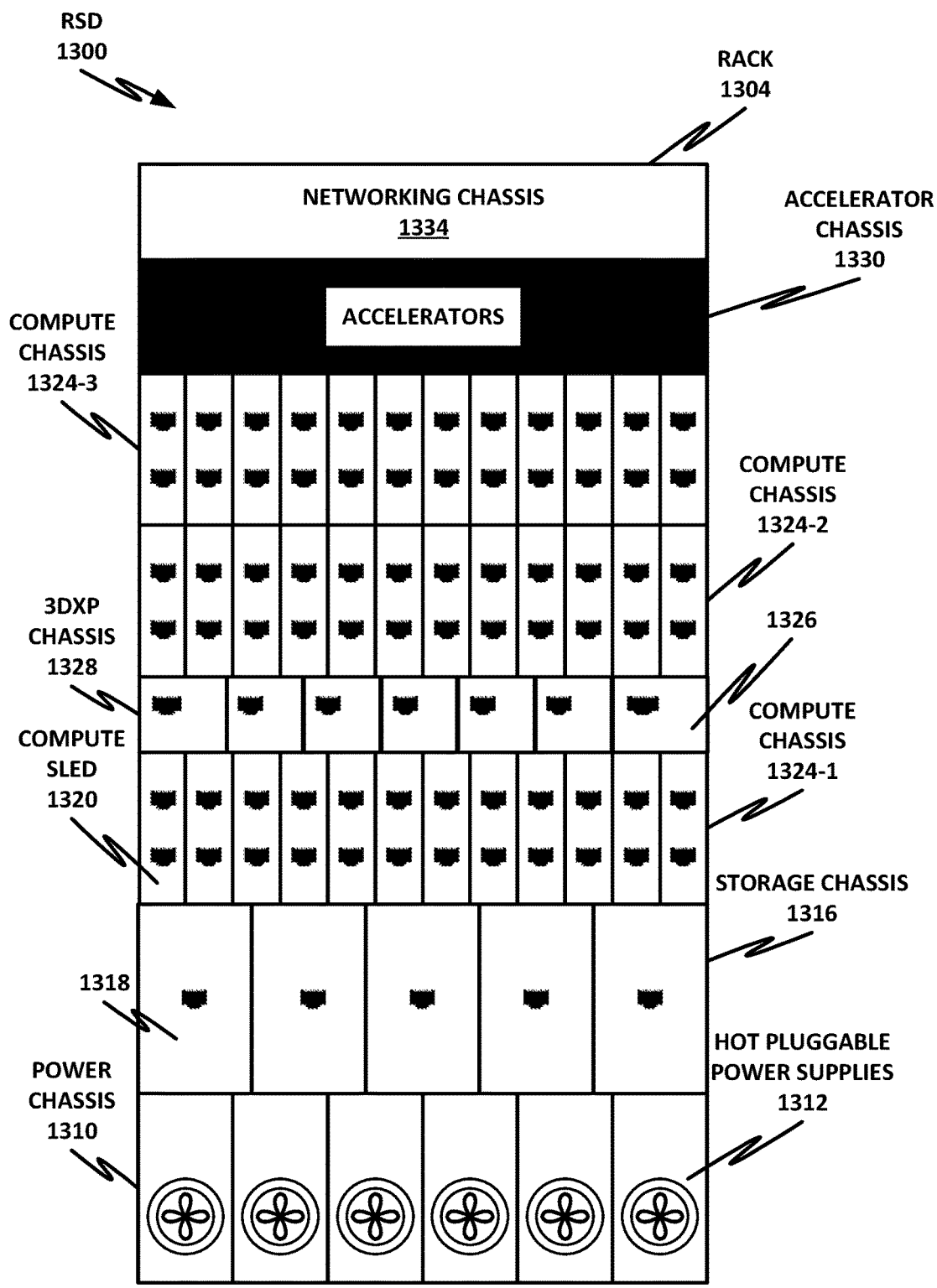
FIG. 13 is a block diagram of rack scale design, according to one or more examples of the present specification.

However, other embodiments are also contemplated. For example, FIG. 13 illustrates rack scale design (RSD). In RSD, a rack may be built according to the standard 42U dimensions, but it may be configured to accommodate line-replaceable units (LRUs) in compute "sleds." In RSD, a sled chassis may or may not be built according to standard rack units. For example, a sled to accommodate processors may fit in a standard 3U configuration, or it may be of an arbitrary size according to preferential design considerations. In RSD, entire pre-populated racks of resources may be provided as a unit, with the rack hosting a plurality of resource sleds, containing such elements as compute (e.g., processors), memory, storage, accelerators, power, networking, and others. Each sled chassis may accommodate a number of LRUs, each embodied in an individual sled. If a resource fails, the LRU hosting that resource can be pulled, and a new one can be modularly inserted. The failed LRU can then be repaired or discarded, depending on the nature of the failure. RSD is especially, though not exclusively, beneficial in the case of software-defined infrastructure (SDI), wherein composite nodes may be built from disaggregated resources. Large resource pools can be provided, and an SDI orchestrator may allocate them to composite nodes as necessary.

Each server 946 may host a standalone operating system and provide a server function, or servers may be virtualized, in which case they may be under the control of a virtual machine manager (VMM), hypervisor, and/or orchestrator, and may host one or more virtual machines, virtual servers, or virtual appliances. These server racks may be collocated in a single data center, or may be located in different geographic data centers. Depending on the contractual agreements, some servers 946 may be specifically dedicated to certain enterprise clients or tenants, while others may be shared.

The various devices in a data center may be connected to each other via a switching fabric 970, which may include one or more high speed routing and/or switching devices. Switching fabric 970 may provide both "north-south" traffic (e.g., traffic to and from the wide area network (WAN), such as the internet), and "east-west" traffic (e.g., traffic across the data center). Historically, north-south traffic accounted for the bulk of network traffic, but as web services become more complex and distributed, the volume of east-west traffic has risen. In many data centers, east-west traffic now accounts for the majority of traffic.

Furthermore, as the capability of each server 946 increases, traffic volume may further increase. For example, each server 946 may provide multiple processor slots, with each slot accommodating a processor having four to eight cores, along with sufficient memory for the cores. Thus, each server may host a number of VMs, each generating its own traffic.

To accommodate the large volume of traffic in a data center, a highly capable switching fabric 970 may be provided. Switching fabric 970 is illustrated in this example as a "flat" network, wherein each server 946 may have a direct connection to a top-of-rack (ToR) switch 920 (e.g., a "star" configuration), and each ToR switch 920 may couple to a core switch 930. This two-tier flat network architecture is shown only as an illustrative example. In other examples, other architectures may be used, such as three-tier star or leaf-spine (also called "fat tree" topologies) based on the "Clos" architecture, hub-and-spoke topologies, mesh topologies, ring topologies, or 3-D mesh topologies, by way of nonlimiting example.

The fabric itself may be provided by any suitable interconnect. For example, each server 946 may include an Intel® Host Fabric Interface (HFI), a NIC, a host channel adapter (HCA), or other host interface. For simplicity and unity, these may be referred to throughout this specification as a "host fabric interface" (HFI), which should be broadly construed as an interface to communicatively couple the host to the data center fabric. The HFI may couple to one or more host processors via an interconnect or bus, such as PCI, PCIe, or similar. In some cases, this interconnect bus, along with other "local" interconnects (e.g., core-to-core Ultra Path Interconnect) may be considered to be part of fabric 970. In other embodiments, the Ultra Path Interconnect (UPI) (or other local coherent interconnect) may be treated as part of the secure domain of the processor complex, and thus not part of the fabric.

The interconnect technology may be provided by a single interconnect or a hybrid interconnect, such as where PCIe provides on-chip communication, 1 Gb or 10 Gb copper Ethernet provides relatively short connections to a ToR switch 920, and optical cabling provides relatively longer connections to core switch 930. Interconnect technologies that may be found in the data center include, by way of nonlimiting example, Intel® Omni-Path™ Architecture (OPA), TrueScale™, UPI (formerly called QPI or KTI), FibreChannel, Ethernet, FibreChannel over Ethernet (FCoE), InfiniBand, PCI, PCIe, or fiber optics, to name just a few. The fabric may be cache- and memory-coherent, cache- and memory-non-coherent, or a hybrid of coherent and non-coherent interconnects. Some interconnects are more popular for certain purposes or functions than others, and selecting an appropriate fabric for the instant application is an exercise of ordinary skill. For example, OPA and Infiniband are commonly used in HPC applications, while Ethernet and FibreChannel are more popular in cloud data centers. But these examples are expressly nonlimiting, and as data centers evolve fabric technologies similarly evolve.

Note that while high-end fabrics such as OPA are provided herein by way of illustration, more generally, fabric 970 may be any suitable interconnect or bus for the particular application. This could, in some cases, include legacy interconnects like local area networks (LANs), token ring networks, synchronous optical networks (SONET), asynchronous transfer mode (ATM) networks, wireless networks such as WiFi and Bluetooth, "plain old telephone system" (POTS) interconnects, or similar. It is also expressly anticipated that in the future, new network technologies may arise to supplement or replace some of those listed here, and any such future network topologies and technologies can be or form a part of fabric 970.

In certain embodiments, fabric 970 may provide communication services on various "layers," as originally outlined in the Open Systems Interconnection (OSI) seven-layer network model. In contemporary practice, the OSI model is not followed strictly. In general terms, layers 1 and 2 are often called the "Ethernet" layer (though in some data centers or supercomputers, Ethernet may be supplanted or supplemented by newer technologies). Layers 3 and 4 are often referred to as the transmission control protocol/internet protocol (TCP/IP) layer (which may be further subdivided into TCP and IP layers). Layers 5-7 may be referred to as the "application layer." These layer definitions are disclosed as a useful framework, but are intended to be nonlimiting.

Figure 10:
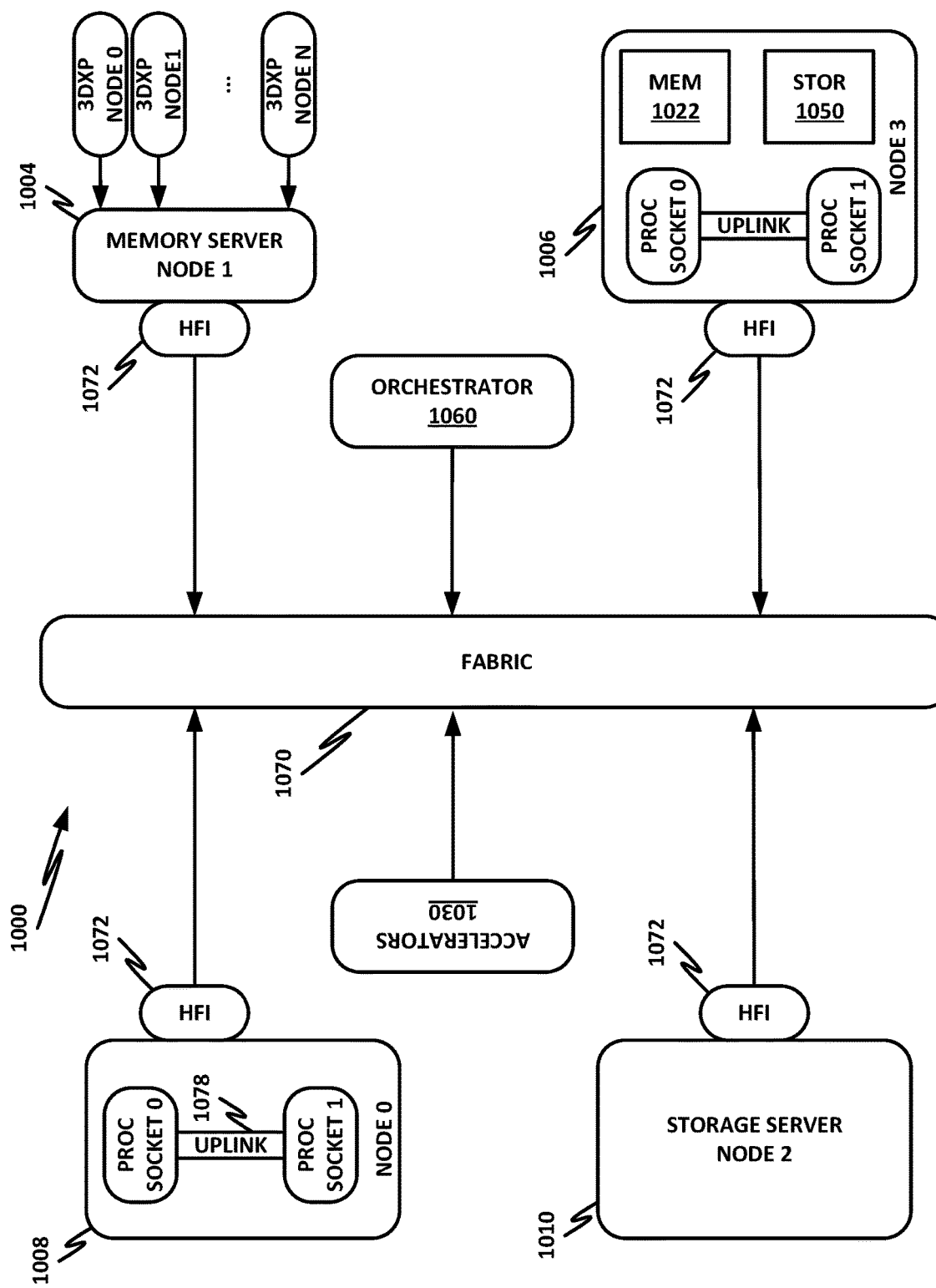
FIG. 10 is a block diagram of selected components of an end-user computing device, according to one or more examples of the present specification.

FIG. 10 is a block diagram of an end-user computing device 1000, according to one or more examples of the present specification. Embodiments of computing device 1000 disclosed herein may be adapted or configured to provide the method of cache monitoring according to the teachings of the present specification.

As above, computing device 1000 may provide, as appropriate, cloud service, high performance computing, telecommunication services, enterprise data center services, or any other compute services that benefit from a computing device 1000.

In this example, a fabric 1070 is provided to interconnect various aspects of computing device 1000. Fabric 1070 may be the same as fabric 970 of FIG. 9, or may be a different fabric. As above, fabric 1070 may be provided by any suitable interconnect technology. In this example, Intel® Omni-Path™ is used as an illustrative and nonlimiting example.

As illustrated, computing device 1000 includes a number of logic elements forming a plurality of nodes. It should be understood that each node may be provided by a physical server, a group of servers, or other hardware. Each server may be running one or more virtual machines as appropriate to its application.

Node 0 1008 is a processing node including a processor socket 0 and processor socket 1. The processors may be, for example, Intel® Xeon™ processors with a plurality of cores, such as 4 or 8 cores. Node 0 1008 may be configured to provide network or workload functions, such as by hosting a plurality of virtual machines or virtual appliances.

Onboard communication between processor socket 0 and processor socket 1 may be provided by an onboard uplink 1078. This may provide a very high speed, short-length interconnect between the two processor sockets, so that virtual machines running on node 0 1008 can communicate with one another at very high speeds. To facilitate this communication, a virtual switch (vSwitch) may be provisioned on node 0 1008, which may be considered to be part of fabric 1070.

Node 0 1008 connects to fabric 1070 via an HFI 1072. HFI 1072 may connect to an Intel® Omni-Path™ fabric. In some examples, communication with fabric 1070 may be tunneled, such as by providing UPI tunneling over Omni-Path™.

Because computing device 1000 may provide many functions in a distributed fashion that in previous generations were provided onboard, a highly capable HFI 1072 may be provided. HFI 1072 may operate at speeds of multiple gigabits per second, and in some cases may be tightly coupled with node 0 1008. For example, in some embodiments, the logic for HFI 1072 is integrated directly with the processors on a system-on-a-chip. This provides very high speed communication between HFI 1072 and the processor sockets, without the need for intermediary bus devices, which may introduce additional latency into the fabric. However, this is not to imply that embodiments where HFI 1072 is provided over a traditional bus are to be excluded. Rather, it is expressly anticipated that in some examples, HFI 1072 may be provided on a bus, such as a PCIe bus, which is a serialized version of PCI that provides higher speeds than traditional PCI. Throughout computing device 1000, various nodes may provide different types of HFIs 1072, such as onboard HFIs and plug-in HFIs. It should also be noted that certain blocks in a system-on-a-chip may be provided as intellectual property (IP) blocks that can be "dropped" into an integrated circuit as a modular unit. Thus, HFI 1072 may in some cases be derived from such an IP block.

Note that in "the network is the device" fashion, node 0 1008 may provide limited or no onboard memory or storage. Rather, node 0 1008 may rely primarily on distributed services, such as a memory server and a networked storage server. Onboard, node 0 1008 may provide only sufficient memory and storage to bootstrap the device and get it communicating with fabric 1070. This kind of distributed architecture is possible because of the very high speeds of contemporary data centers, and may be advantageous because there is no need to over-provision resources for each node. Rather, a large pool of high speed or specialized memory may be dynamically provisioned between a number of nodes, so that each node has access to a large pool of resources, but those resources do not sit idle when that particular node does not need them.

In this example, a node 1 memory server 1004 and a node 2 storage server 1010 provide the operational memory and storage capabilities of node 0 1008. For example, memory server node 1 1004 may provide remote direct memory access (RDMA), whereby node 0 1008 may access memory resources on node 1 1004 via fabric 1070 in a direct memory access fashion, similar to how it would access its own onboard memory. The memory provided by memory server 1004 may be traditional memory, such as double data rate type 3 (DDR3) dynamic random access memory (DRAM), which is volatile, or may be a more exotic type of memory, such as a persistent fast memory (PFM) like Intel® 3D Crosspoint™ (3DXP), which operates at DRAM-like speeds, but is nonvolatile.

Similarly, rather than providing an onboard hard disk for node 0 1008, a storage server node 2 1010 may be provided. Storage server 1010 may provide a networked bunch of disks (NBOD), PFM, redundant array of independent disks (RAID), redundant array of independent nodes (RAIN), network attached storage (NAS), optical storage, tape drives, or other nonvolatile memory solutions.

Thus, in performing its designated function, node 0 1008 may access memory from memory server 1004 and store results on storage provided by storage server 1010. Each of these devices couples to fabric 1070 via a HFI 1072, which provides fast communication that makes these technologies possible.

By way of further illustration, node 3 1006 is also depicted. Node 3 1006 also includes a HFI 1072, along with two processor sockets internally connected by an uplink. However, unlike node 0 1008, node 3 1006 includes its own onboard memory 1022 and storage 1050. Thus, node 3 1006 may be configured to perform its functions primarily onboard, and may not be required to rely upon memory server 1004 and storage server 1010. However, in appropriate circumstances, node 3 1006 may supplement its own onboard memory 1022 and storage 1050 with distributed resources similar to node 0 1008.

Computing device 1000 may also include accelerators 1030. These may provide various accelerated functions, including hardware or co-processor acceleration for functions such as packet processing, encryption, decryption, compression, decompression, network security, or other accelerated functions in the data center. In some examples, accelerators 1030 may include deep learning accelerators that may be directly attached to one or more cores in nodes such as node 0 1008 or node 3 1006. Examples of such accelerators can include, by way of nonlimiting example, Intel® QuickData Technology (QDT), Intel® QuickAssist Technology (QAT), Intel® Direct Cache Access (DCA), Intel® Extended Message Signaled Interrupt (MSI-X), Intel® Receive Side Coalescing (RSC), and other acceleration technologies.

In other embodiments, an accelerator could also be provided as an application-specific integrated circuit (ASIC), field-programmable gate array (FPGA), co-processor, graphics processing unit (GPU), digital signal processor (DSP), or other processing entity, which may optionally be tuned or configured to provide the accelerator function.

The basic building block of the various components disclosed herein may be referred to as "logic elements." Logic elements may include hardware (including, for example, a software-programmable processor, an ASIC, or an FPGA), external hardware (digital, analog, or mixed-signal), software, reciprocating software, services, drivers, interfaces, components, modules, algorithms, sensors, components, firmware, microcode, programmable logic, or objects that can coordinate to achieve a logical operation. Furthermore, some logic elements are provided by a tangible, non-transitory computer-readable medium having stored thereon executable instructions for instructing a processor to perform a certain task. Such a non-transitory medium could include, for example, a hard disk, solid state memory or disk, read-only memory (ROM), PFM (e.g., Intel® 3D Crosspoint™), external storage, RAID, RAIN, NAS, optical storage, tape drive, backup system, cloud storage, or any combination of the foregoing by way of nonlimiting example. Such a medium could also include instructions programmed into a field-programmable gate array (FPGA), or encoded in hardware on an ASIC or processor. In embodiments of the present disclosure, an FPGA is a species of configurable logic circuit in which gates can by dynamically arranged to realize logic that operates at speeds similar to those realized in integrated circuits.

Figure 11:
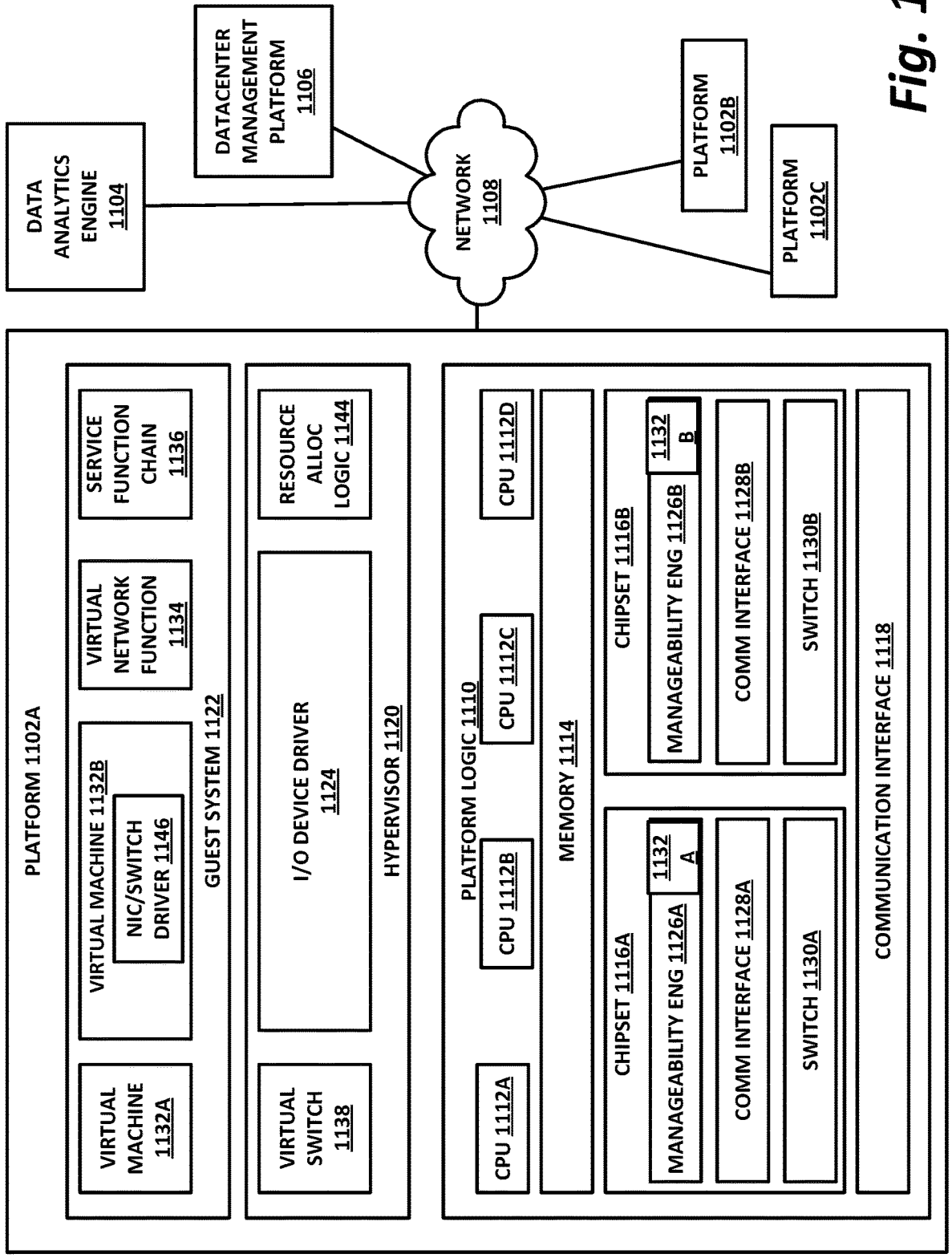
FIG. 11 is a block diagram of components of a computing platform, according to one or more examples of the present specification.

FIG. 11 is a block diagram of components of a computing platform 1102A according to one or more examples of the present specification. Embodiments of computing platform 1102A disclosed herein may be adapted or configured to provide the method of cache monitoring according to the teachings of the present specification.

In the embodiment depicted, platforms 1102A, 1102B, and 1102C, along with a data center management platform 1106 and data analytics engine 1104 are interconnected via network 1108. In other embodiments, a computer system may include any suitable number of (i.e., one or more) platforms. In some embodiments (e.g., when a computer system only includes a single platform), all or a portion of the system management platform 1106 may be included on a platform 1102. A platform 1102 may include platform logic 1110 with one or more central processing units (CPUs) 1112, memories 1114 (which may include any number of different modules), chipsets 1116, communication interfaces 1118, and any other suitable hardware and/or software to execute a hypervisor 1120 or other operating system capable of executing workloads associated with applications running on platform 1102. In some embodiments, a platform 1102 may function as a host platform for one or more guest systems 1122 that invoke these applications. Platform 1102A may represent any suitable computing environment, such as a high performance computing environment, a data center, a communications service provider infrastructure (e.g., one or more portions of an Evolved Packet Core), an in-memory computing environment, a computing system of a vehicle (e.g., an automobile or airplane), an Internet of Things environment, an industrial control system, other computing environment, or combination thereof.

In various embodiments of the present disclosure, accumulated stress and/or rates of stress accumulated of a plurality of hardware resources (e.g., cores and uncores) are monitored and entities (e.g., system management platform 1106, hypervisor 1120, or other operating system) of computer platform 1102A may assign hardware resources of platform logic 1110 to perform workloads in accordance with the stress information. In some embodiments, self-diagnostic capabilities may be combined with the stress monitoring to more accurately determine the health of the hardware resources. Each platform 1102 may include platform logic 1110. Platform logic 1110 comprises, among other logic enabling the functionality of platform 1102, one or more CPUs 1112, memory 1114, one or more chipsets 1116, and communication interfaces 1128. Although three platforms are illustrated, computer platform 1102A may be interconnected with any suitable number of platforms. In various embodiments, a platform 1102 may reside on a circuit board that is installed in a chassis, rack, or other suitable structure that comprises multiple platforms coupled together through network 1108 (which may comprise, e.g., a rack or backplane switch).

CPUs 1112 may each comprise any suitable number of processor cores and supporting logic (e.g., uncores). The cores may be coupled to each other, to memory 1114, to at least one chipset 1116, and/or to a communication interface 1118, through one or more controllers residing on CPU 1112 and/or chipset 1116. In particular embodiments, a CPU 1112 is embodied within a socket that is permanently or removably coupled to platform 1102A. Although four CPUs are shown, a platform 1102 may include any suitable number of CPUs.

Memory 1114 may comprise any form of volatile or nonvolatile memory including, without limitation, magnetic media (e.g., one or more tape drives), optical media, random access memory (RAM), ROM, flash memory, removable media, or any other suitable local or remote memory component or components. Memory 1114 may be used for short, medium, and/or long term storage by platform 1102A. Memory 1114 may store any suitable data or information utilized by platform logic 1110, including software embedded in a computer-readable medium, and/or encoded logic incorporated in hardware or otherwise stored (e.g., firmware). Memory 1114 may store data that is used by cores of CPUs 1112. In some embodiments, memory 1114 may also comprise storage for instructions that may be executed by the cores of CPUs 1112 or other processing elements (e.g., logic resident on chipsets 1116) to provide functionality associated with the manageability engine 1126 or other components of platform logic 1110. A platform 1102 may also include one or more chipsets 1116 comprising any suitable logic to support the operation of the CPUs 1112. In various embodiments, chipset 1116 may reside on the same die or package as a CPU 1112 or on one or more different dies or packages. Each chipset may support any suitable number of CPUs 1112. A chipset 1116 may also include one or more controllers to couple other components of platform logic 1110 (e.g., communication interface 1118 or memory 1114) to one or more CPUs. In the embodiment depicted, each chipset 1116 also includes a manageability engine 1126. Manageability engine 1126 may include any suitable logic to support the operation of chipset 1116. In a particular embodiment, a manageability engine 1126 (which may also be referred to as an innovation engine) is capable of collecting real-time telemetry data from the chipset 1116, the CPU(s) 1112 and/or memory 1114 managed by the chipset 1116, other components of platform logic 1110, and/or various connections between components of platform logic 1110. In various embodiments, the telemetry data collected includes the stress information described herein.

In various embodiments, a manageability engine 1126 operates as an out-of-band asynchronous compute agent which is capable of interfacing with the various elements of platform logic 1110 to collect telemetry data with no or minimal disruption to running processes on CPUs 1112. For example, manageability engine 1126 may comprise a dedicated processing element (e.g., a processor, controller, or other logic) on chipset 1116, which provides the functionality of manageability engine 1126 (e.g., by executing software instructions), thus conserving processing cycles of CPUs 1112 for operations associated with the workloads performed by the platform logic 1110. Moreover the dedicated logic for the manageability engine 1126 may operate asynchronously with respect to the CPUs 1112 and may gather at least some of the telemetry data without increasing the load on the CPUs.

A manageability engine 1126 may process telemetry data it collects (specific examples of the processing of stress information are provided herein). In various embodiments, manageability engine 1126 reports the data it collects and/or the results of its processing to other elements in the computer system, such as one or more hypervisors 1120 or other operating systems and/or system management software (which may run on any suitable logic such as system management platform 1106). In particular embodiments, a critical event such as a core that has accumulated an excessive amount of stress may be reported prior to the normal interval for reporting telemetry data (e.g., a notification may be sent immediately upon detection).

Additionally, manageability engine 1126 may include programmable code configurable to set which CPU(s) 1112 a particular chipset 1116 manages and/or which telemetry data may be collected.

Chipsets 1116 also each include a communication interface 1128. Communication interface 1128 may be used for the communication of signaling and/or data between chipset 1116 and one or more I/O devices, one or more networks 1108, and/or one or more devices coupled to network 1108 (e.g., system management platform 1106). For example, communication interface 1128 may be used to send and receive network traffic such as data packets. In a particular embodiment, a communication interface 1128 comprises one or more physical network interface controllers (NICs), also known as network interface cards or network adapters. A NIC may include electronic circuitry to communicate using any suitable physical layer and data link layer standard such as Ethernet (e.g., as defined by a IEEE 802.3 standard), Fibre Channel, InfiniBand, Wi-Fi, or other suitable standard. A NIC may include one or more physical ports that may couple to a cable (e.g., an Ethernet cable). A NIC may enable communication between any suitable element of chipset 1116 (e.g., manageability engine 1126 or switch 1130) and another device coupled to network 1108. In various embodiments a NIC may be integrated with the chipset (i.e., may be on the same integrated circuit or circuit board as the rest of the chipset logic) or may be on a different integrated circuit or circuit board that is electromechanically coupled to the chipset.

In particular embodiments, communication interfaces 1128 may allow communication of data (e.g., between the manageability engine 1126 and the data center management platform 1106) associated with management and monitoring functions performed by manageability engine 1126. In various embodiments, manageability engine 1126 may utilize elements (e.g., one or more NICs) of communication interfaces 1128 to report the telemetry data (e.g., to system management platform 1106) in order to reserve usage of NICs of communication interface 1118 for operations associated with workloads performed by platform logic 1110.

Switches 1130 may couple to various ports (e.g., provided by NICs) of communication interface 1128 and may switch data between these ports and various components of chipset 1116 (e.g., one or more peripheral component interconnect express (PCIe) lanes coupled to CPUs 1112). Switches 1130 may be a physical or virtual (i.e., software) switch.

Platform logic 1110 may include an additional communication interface 1118. Similar to communication interfaces 1128, communication interfaces 1118 may be used for the communication of signaling and/or data between platform logic 1110 and one or more networks 1108 and one or more devices coupled to the network 1108. For example, communication interface 1118 may be used to send and receive network traffic such as data packets. In a particular embodiment, communication interfaces 1118 comprise one or more physical NICs. These NICs may enable communication between any suitable element of platform logic 1110 (e.g., CPUs 1112 or memory 1114) and another device coupled to network 1108 (e.g., elements of other platforms or remote computing devices coupled to network 1108 through one or more networks).

Platform logic 1110 may receive and perform any suitable types of workloads. A workload may include any request to utilize one or more resources of platform logic 1110, such as one or more cores or associated logic. For example, a workload may comprise a request to instantiate a software component, such as an I/O device driver 1124 or guest system 1122; a request to process a network packet received from a virtual machine 1132 or device external to platform 1102A (such as a network node coupled to network 1108); a request to execute a process or thread associated with a guest system 1122, an application running on platform 1102A, a hypervisor 1120 or other operating system running on platform 1102A; or other suitable processing request.

A virtual machine 1132 may emulate a computer system with its own dedicated hardware. A virtual machine 1132 may run a guest operating system on top of the hypervisor 1120. The components of platform logic 1110 (e.g., CPUs 1112, memory 1114, chipset 1116, and communication interface 1118) may be virtualized such that it appears to the guest operating system that the virtual machine 1132 has its own dedicated components.

A virtual machine 1132 may include a virtualized NIC (vNIC), which is used by the virtual machine as its network interface. A vNIC may be assigned a media access control (MAC) address or other identifier, thus allowing multiple virtual machines 1132 to be individually addressable in a network.

VNF 1134 may comprise a software implementation of a functional building block with defined interfaces and behavior that can be deployed in a virtualized infrastructure. In particular embodiments, a VNF 1134 may include one or more virtual machines 1132 that collectively provide specific functionalities (e.g., WAN optimization, virtual private network (VPN) termination, firewall operations, load-balancing operations, security functions, etc.). A VNF 1134 running on platform logic 1110 may provide the same functionality as traditional network components implemented through dedicated hardware. For example, a VNF 1134 may include components to perform any suitable network function virtualization (NFV) workloads, such as virtualized evolved packet core (vEPC) components, mobility management entities, 3rd Generation Partnership Project (3GPP) control and data plane components, etc.

SFC 1136 is a group of VNFs 1134 organized as a chain to perform a series of operations, such as network packet processing operations. Service function chaining may provide the ability to define an ordered list of network services (e.g. firewalls, load balancers) that are stitched together in the network to create a service chain.

A hypervisor 1120 (also known as a virtual machine monitor) may comprise logic to create and run guest systems 1122. The hypervisor 1120 may present guest operating systems run by virtual machines with a virtual operating platform (i.e., it appears to the virtual machines that they are running on separate physical nodes when they are actually consolidated onto a single hardware platform) and manage the execution of the guest operating systems by platform logic 1110. Services of hypervisor 1120 may be provided by virtualizing in software or through hardware assisted resources that require minimal software intervention, or both. Multiple instances of a variety of guest operating systems may be managed by the hypervisor 1120. Each platform 1102 may have a separate instantiation of a hypervisor 1120.

Hypervisor 1120 may be a native or bare-metal hypervisor that runs directly on platform logic 1110 to control the platform logic and manage the guest operating systems. Alternatively, hypervisor 1120 may be a hosted hypervisor that runs on a host operating system and abstracts the guest operating systems from the host operating system. Hypervisor 1120 may include a virtual switch 1138 that may provide virtual switching and/or routing functions to virtual machines of guest systems 1122. The virtual switch 1138 may comprise a logical switching fabric that couples the vNICs of the virtual machines 1132 to each other, thus creating a virtual network through which virtual machines may communicate with each other.

Virtual switch 1138 may comprise a software element that is executed using components of platform logic 1110. In various embodiments, hypervisor 1120 may be in communication with any suitable entity (e.g., an SDN controller) which may cause hypervisor 1120 to reconfigure the parameters of virtual switch 1138 in response to changing conditions in platform 1102 (e.g., the addition or deletion of virtual machines 1132 or identification of optimizations that may be made to enhance performance of the platform).

Hypervisor 1120 may also include resource allocation logic 1144, which may include logic for determining allocation of platform resources based on the telemetry data (which may include stress information). Resource allocation logic 1144 may also include logic for communicating with various components of platform logic 1110 entities of platform 1102A to implement such optimization, such as components of platform logic 1110.

Any suitable logic may make one or more of these optimization decisions. For example, system management platform 1106; resource allocation logic 1144 of hypervisor 1120 or other operating system; or other logic of computer platform 1102A may be capable of making such decisions. In various embodiments, the system management platform 1106 may receive telemetry data from and manage workload placement across multiple platforms 1102. The system management platform 1106 may communicate with hypervisors 1120 (e.g., in an out-of-band manner) or other operating systems of the various platforms 1102 to implement workload placements directed by the system management platform.

The elements of platform logic 1110 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g., cache-coherent) bus, a layered protocol architecture, a differential bus, or a Gunning transceiver logic (GTL) bus.

In embodiments of the present specification, cache coherency is a memory architecture that provides uniform sharing and mapping between a plurality of caches. For example, the caches may map to the same address space. If two different caches have cached the same address in the shared address space, a coherency agent provides logic (hardware and/or software) to ensure the compatibility and uniformity of shared resource. For example, if two caches have cached the same address, when the value stored in that address is updated in one cache, the coherency agent ensures that the change is propagated to the other cache. Coherency may be maintained, for example, via "snooping," wherein each cache monitors the address lines of each other cache, and detects updates. Cache coherency may also be maintained via a directory-based system, in which shared data are placed in a shared directory that maintains coherency. Some distributed shared memory architectures may also provide coherency, for example by emulating the foregoing mechanisms.

Coherency may be either "snoopy" or directory-based. In snoopy protocols, coherency may be maintained via write-invalidate, wherein a first cache that snoops a write to the same address in a second cache invalidates its own copy. This forces a read from memory if a program tries to read the value from the first cache. Alternatively, in write update, a first cache snoops a write to a second cache, and a cache controller (which may include a coherency agent) copies the data out and updates the copy in the first cache.

By way of nonlimiting example, current cache coherency models include MSI (modified, shared, invalid), MESI (modified, exclusive, shared, invalid), MOSI (modified, owned, shared, invalid), MOESI (modified, owned, exclusive, shared, invalid), MERSI (modified, exclusive, read-only or recent, shared, invalid), MESIF (modified, exclusive, shared, invalid, forward), write-once, Synapse, Berkeley, Firefly, and Dragon protocols. Furthermore, ARM processors may use advanced microcontroller bus architecture (AMBA), including AMBA 4 ACE, to provide cache coherency in systems-on-a-chip (SoCs) or elsewhere.

Elements of the computer platform 1102A may be coupled together in any suitable manner such as through one or more networks 1108. A network 1108 may be any suitable network or combination of one or more networks operating using one or more suitable networking protocols. A network may represent a series of nodes, points, and interconnected communication paths for receiving and transmitting packets of information that propagate through a communication system. For example, a network may include one or more firewalls, routers, switches, security appliances, antivirus servers, or other useful network devices.

Figure 12:
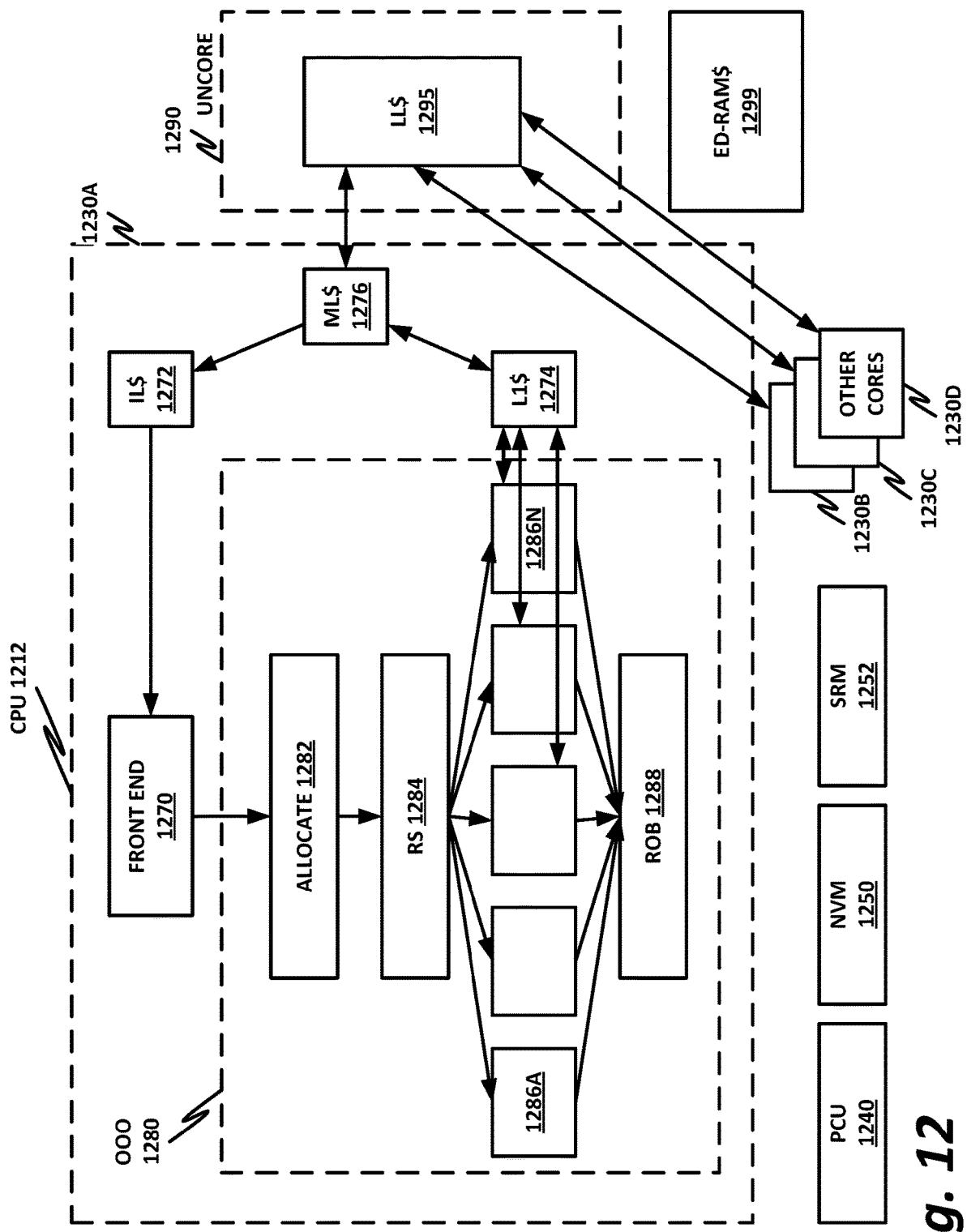
FIG. 12 is a block diagram of a CPU, according to one or more examples of the present specification.

FIG. 12 illustrates a block diagram of a CPU 1212, according to one or more examples of the present specification. Embodiments of CPU 1212 disclosed herein may be adapted or configured to provide the method of cache monitoring according to the teachings of the present specification. In particular, CPU 1212 may include an SRM, as illustrated in FIG. 7.

Although CPU 1212 depicts a particular configuration, the cores and other components of CPU 1212 may be arranged in any suitable manner. CPU 1212 may comprise any processor or processing device, such as a microprocessor, an embedded processor, a DSP, a network processor, an application processor, a co-processor, an SoC, or other device to execute code. CPU 1212, in the depicted embodiment, includes four processing elements (cores 1230 in the depicted embodiment), which may include asymmetric processing elements or symmetric processing elements. However, CPU 1212 may include any number of processing elements that may be symmetric or asymmetric.

Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. A physical CPU may include any suitable number of cores. In various embodiments, cores may include one or more out-of-order processor cores or one or more in-order processor cores. However, cores may be individually selected from any type of core, such as a native core, a software managed core, a core adapted to execute a native instruction set architecture (ISA), a core adapted to execute a translated ISA, a co-designed core, or other known core. In a heterogeneous core environment (i.e. asymmetric cores), some form of translation, such as binary translation, may be utilized to schedule or execute code on one or both cores.

In the embodiment depicted, core 1230A includes an out-of-order processor that has a front end unit 1270 used to fetch incoming instructions, perform various processing (e.g. caching, decoding, branch predicting, etc.) and passing instructions/operations along to an out-of-order (OOO) engine. The OOO engine performs further processing on decoded instructions.

A front end 1270 may include a decode module coupled to fetch logic to decode fetched elements. Fetch logic, in one embodiment, includes individual sequencers associated with thread slots of cores 1230. Usually a core 1230 is associated with a first ISA, which defines/specifies instructions executable on core 1230. Often machine code instructions that are part of the first ISA include a portion of the instruction (referred to as an opcode), which references/specifies an instruction or operation to be performed. The decode module may include circuitry that recognizes these instructions from their opcodes and passes the decoded instructions on in the pipeline for processing as defined by the first ISA. Decoders of cores 1230, in one embodiment, recognize the same ISA (or a subset thereof). Alternatively, in a heterogeneous core environment, a decoder of one or more cores (e.g., core 1230B) may recognize a second ISA (either a subset of the first ISA or a distinct ISA).

In the embodiment depicted, the out-of-order engine includes an allocate unit 1282 to receive decoded instructions, which may be in the form of one or more microinstructions or uops, from front end unit 1270, and allocate them to appropriate resources such as registers and so forth. Next, the instructions are provided to a reservation station 1284, which reserves resources and schedules them for execution on one of a plurality of execution units 1286A-1286N. Various types of execution units may be present, including, for example, arithmetic logic units (ALUs), load and store units, vector processing units (VPUs), floating point execution units, among others. Results from these different execution units are provided to a reorder buffer (ROB) 1288, which take unordered results and return them to correct program order.

In the embodiment depicted, both front end unit 1270 and out-of-order engine 1280 are coupled to different levels of a memory hierarchy. Specifically shown is an instruction level cache 1272, that in turn couples to a mid-level cache 1276, that in turn couples to a last-level cache 1295. In one embodiment, last-level cache 1295 is implemented in an on-chip (sometimes referred to as uncore) unit 1290. Uncore 1290 may communicate with system memory 1299, which, in the illustrated embodiment, is implemented via embedded DRAM (eDRAM). The various execution units 1286 within 000 engine 1280 are in communication with a first level cache 1274 that also is in communication with mid-level cache 1276. Additional cores 1230B-1230D may couple to last-level cache 1295 as well.

In particular embodiments, uncore 1290 may be in a voltage domain and/or a frequency domain that is separate from voltage domains and/or frequency domains of the cores. That is, uncore 1290 may be powered by a supply voltage that is different from the supply voltages used to power the cores and/or may operate at a frequency that is different from the operating frequencies of the cores.

CPU 1212 may also include a power control unit (PCU) 1240. In various embodiments, PCU 1240 may control the supply voltages and the operating frequencies applied to each of the cores (on a per-core basis) and to the uncore. PCU 1240 may also instruct a core or uncore to enter an idle state (where no voltage and clock are supplied) when not performing a workload.

In various embodiments, PCU 1240 may detect one or more stress characteristics of a hardware resource, such as the cores and the uncore. A stress characteristic may comprise an indication of an amount of stress that is being placed on the hardware resource. As examples, a stress characteristic may be a voltage or frequency applied to the hardware resource; a power level, current level, or voltage level sensed at the hardware resource; a temperature sensed at the hardware resource; or other suitable measurement. In various embodiments, multiple measurements (e.g., at different locations) of a particular stress characteristic may be performed when sensing the stress characteristic at a particular instance of time. In various embodiments, PCU 1240 may detect stress characteristics at any suitable interval.

In various embodiments, PCU 1240 is a component that is discrete from the cores 1230. In particular embodiments, PCU 1240 runs at a clock frequency that is different from the clock frequencies used by cores 1230. In some embodiments where the PCU is a microcontroller, PCU 1240 executes instructions according to an ISA that is different from an ISA used by cores 1230.

In various embodiments, CPU 1212 may also include a nonvolatile memory 1250 to store stress information (such as stress characteristics, incremental stress values, accumulated stress values, stress accumulation rates, or other stress information) associated with cores 1230 or uncore 1290, such that when power is lost, the stress information is maintained.

As illustrated in FIG. 12, CPU 1212 may further include SRM 1252. In embodiments of the present disclosure, SRM 1252 provides a unified I/O architecture that achieves high performance, reduces memory bandwidth and energy consumption significantly, and thus reduces latency in computing operations.

FIG. 13 is a block diagram of rack scale design (RSD) 1300 according to one or more examples of the present specification. Embodiments of RSD 1300 disclosed herein may be adapted or configured to provide the method of cache monitoring according to the teachings of the present specification.

In this example, RSD 1300 includes a single rack 1304, to illustrate certain principles of RSD. It should be understood that RSD 1300 may include many such racks, and that the racks need not be identical to one another. In some cases a multipurpose rack such as rack 1304 may be provided, while in other examples, single-purpose racks may be provided. For example, rack 1304 may be considered a highly inclusive rack that includes resources that may be used to allocate a large number of composite nodes. On the other hand, other examples could include a rack dedicated solely to compute sleds, storage sleds, memory sleds, and other resource types, which together can be integrated into composite nodes. Thus, rack 1304 of FIG. 13 should be understood to be a nonlimiting example of a rack that may be used in RSD 1300.

In the example of FIG. 13, rack 1304 may be a standard rack with an external width of approximately 23.6 inches and a height of 78.74 inches. In common usage, this is referred to as a "42U rack." However, rack 1304 need not conform to the "rack unit" standard. Rather, rack 1304 may include a number of chassis that are optimized for their purposes.

Rack 1304 may be marketed and sold as a monolithic unit, with a number of LRUs within each chassis. The LRUs in this case may be sleds, and thus can be easily swapped out when a replacement needs to be made.

In this example, rack 1304 includes a power chassis 1310, a storage chassis 1316, three compute chassis (1324-1, 1324-2, and 1324-3), a 3-D Crosspoint™ (3DXP) chassis 1328, an accelerator chassis 1330, and a networking chassis 1334. Each chassis may include one or more LRU sleds holding the appropriate resources. For example, power chassis 1310 includes a number of hot pluggable power supplies 1312, which may provide shared power to rack 1304. In other embodiments, some sled chassis may also include their own power supplies, depending on the needs of the embodiment.

Storage chassis 1316 includes a number of storage sleds 1318. Compute chassis 1324 each contain a number of compute sleds 1320. 3DXP chassis 1328 may include a number of 3DXP sleds 1326, each hosting a 3DXP memory server. And accelerator chassis 1330 may host a number of accelerators, such as Intel® Quick Assist™ technology (QAT), FPGAs, ASICs, or other accelerators of the same or different types. Accelerators within accelerator chassis 1330 may be the same type or of different types according to the needs of a particular embodiment.

Over time, the various LRUs within rack 1304 may become damaged, outdated, or may experience functional errors. As this happens, LRUs may be pulled and replaced with compatible LRUs, thus allowing the rack to continue full scale operation.

Figure 14:
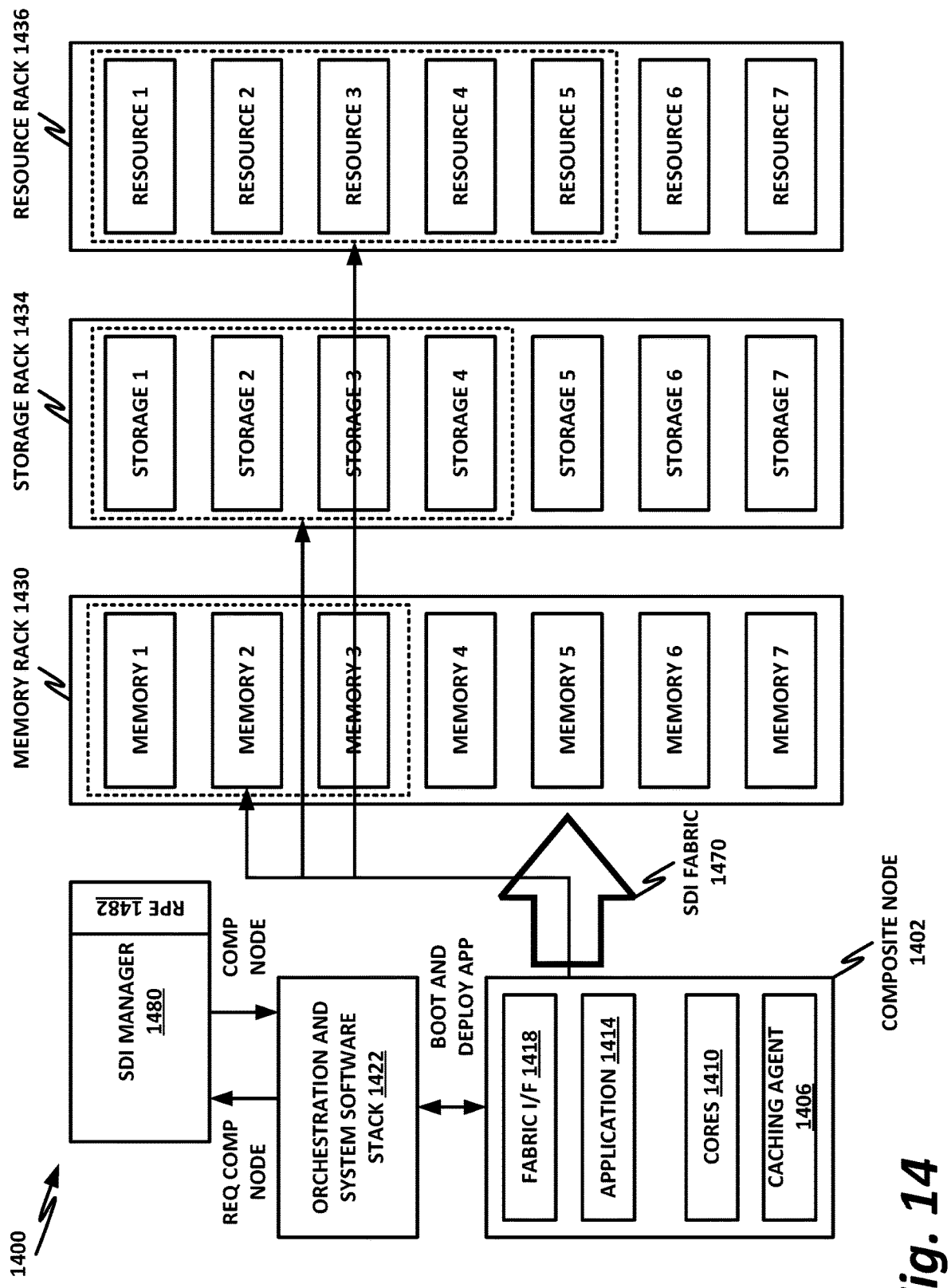
FIG. 14 is a block diagram of a software-defined infrastructure (SDI) data center, according to one or more examples of the present specification.

FIG. 14 is a block diagram of a software-defined infrastructure (SDI) data center 1400, according to one or more examples of the present specification. Embodiments of SDI data center 1400 disclosed herein may be adapted or configured to provide the method of cache monitoring according to the teachings of the present specification.

Certain applications hosted within SDI data center 1400 may employ a set of resources to achieve their designated purposes, such as processing database queries, serving web pages, or providing computer intelligence.

Certain applications tend to be sensitive to a particular subset of resources. For example, SAP HANA is an in-memory, column-oriented relational database system. A SAP HANA database may use processors, memory, disk, and fabric, while being most sensitive to memory and processors. In one embodiment, composite node 1402 includes one or more cores 1410 that perform the processing function. Node 1402 may also include caching agents 1406 that provide access to high speed cache. One or more applications 1414 run on node 1402, and communicate with the SDI fabric via FA 1418. Dynamically provisioning resources to node 1402 may include selecting a set of resources and ensuring that the quantities and qualities provided meet required performance indicators, such as SLAs and quality of service (QoS). Resource selection and allocation for application 1414 may be performed by a resource manager, which may be implemented within orchestration and system software stack 1422. By way of nonlimiting example, throughout this specification the resource manager may be treated as though it can be implemented separately or by an orchestrator. Note that many different configurations are possible.

In an SDI data center, applications may be executed by a composite node such as node 1402 that is dynamically allocated by SDI manager 1480. Such nodes are referred to as composite nodes because they are not nodes where all of the resources are necessarily collocated. Rather, they may include resources that are distributed in different parts of the data center, dynamically allocated, and virtualized to the specific application 1414.

In this example, memory resources from three memory sleds from memory rack 1430 are allocated to node 1402, storage resources from four storage sleds from storage rack 1434 are allocated, and additional resources from five resource sleds from resource rack 1436 are allocated to application 1414 running on composite node 1402. All of these resources may be associated to a particular compute sled and aggregated to create the composite node. Once the composite node is created, the operating system may be booted in node 1402, and the application may start running using the aggregated resources as if they were physically collocated resources. As described above, FA 1418 may provide certain interfaces that enable this operation to occur seamlessly with respect to node 1402.

As a general proposition, the more memory and compute resources that are added to a database processor, the better throughput it can achieve. However, this is not necessarily true for the disk or fabric. Adding more disk and fabric bandwidth may not necessarily increase the performance of the SAP HANA database beyond a certain threshold.

SDI data center 1400 may address the scaling of resources by mapping an appropriate amount of offboard resources to the application based on application requirements provided by a user or network administrator or directly by the application itself. This may include allocating resources from various resource racks, such as memory rack 1430, storage rack 1434, and resource rack 1436.

In an example, SDI controller 1480 also includes a resource protection engine (RPE) 1482, which is configured to assign permission for various target resources to disaggregated compute resources (DRCs) that are permitted to access them. In this example, the resources are expected to be enforced by an FA servicing the target resource.

In certain embodiments, elements of SDI data center 1400 may be adapted or configured to operate with the disaggregated telemetry model of the present specification.

Figure 15:
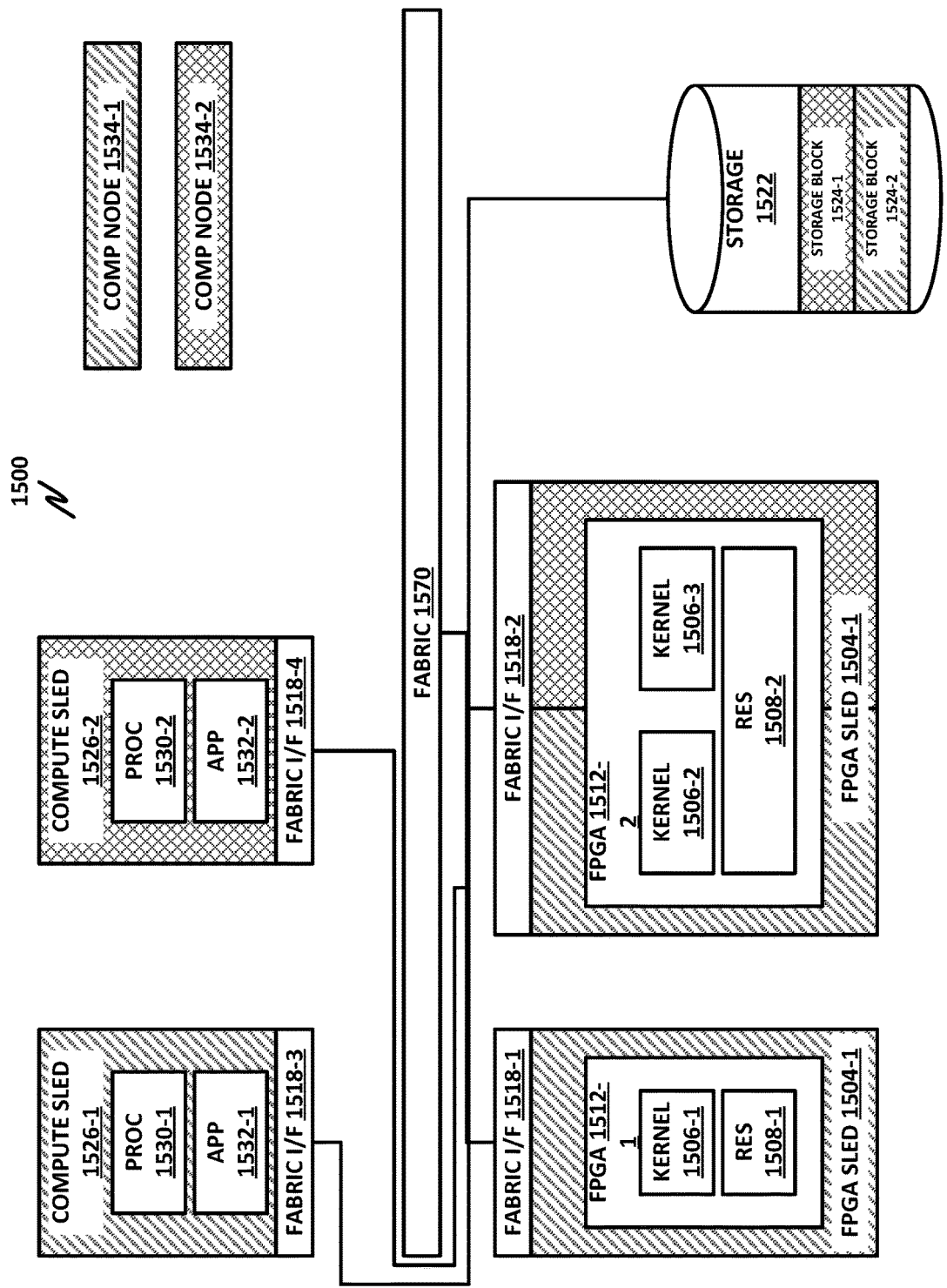
FIG. 15 is a block diagram of a data center, according to one or more examples of the present specification.

FIG. 15 is a block diagram of a data center 1500, according to one or more examples of the present specification. Embodiments of data center 1500 disclosed herein may be adapted or configured to provide the method of cache monitoring according to the teachings of the present specification.

In the example of FIG. 15, two composite nodes, namely composite node 1534-1 and composite node 1534-2 are defined.

Data center 1500 includes a number of resources that may be disaggregated and that may be defined as part of a composite node according to the teachings of the present specification. For example, compute sleds 1526-1 and 1526-2 each include a processor, respectively 1530-1 and 1530-2. Each processor 1530 may host a respective application, 1532-1 and 1532-2.

Note that in various embodiments, compute sleds 1526-1 may also provide local memory, storage, accelerators, or other resources for processor 1530-1. However, in accordance with the SDI teachings of the present specification, certain resources assigned to composite nodes 1534 may also be disaggregated, or physically remote from processors 1530. In this example, each composite node 1534 has assigned to it one or more FPGAs 1512 residing in FPGA sleds 1504. These FPGAs may provide an accelerated function operating at near hardware speeds, and provided by a kernel 1506. Each FPGA 1512 may also have access to certain local FPGA resources 1508. Composite node 1534 may also have access to storage blocks 1524 within storage sled 1522. Storage 1522 may also be a disaggregated resource provided in a resource sled.

It should be noted that, for simplicity and clarity of the illustration, only selected components are disclosed in this illustration. However, other disaggregated resources may also be provided. For example, data center 1500 may include a memory server providing disaggregated memory, including persistent fast memory, which composite nodes 1534 may access via RDMA.

In this example, composite node 1534-1 includes processor 1530-1 on compute sled 1526-1, running application 1532-1, and accessing fabric 1570 via FA 1518-3. Composite node 1534-1 also includes FPGA 1512-1 running on FPGA sled 1504-1, running FPGA kernel 1506-1, and having access to FPGA resources 1508-1. FPGA sled 1504-1 may access fabric 1570 via FA 1518-1. Note that in this example, a plurality of FPGAs on FPGA sled 1504-1 may be connected to one another via a passive backplane, and a single FA 1518-1 may be provided for the entire sled. Composite node 1534-1 may also have access to storage block 1524-1 on storage sled 1522. Within FPGA sled 1504-2, FPGA 1512-2 has access to a shared resource 1508-2, which is accessed by two different kernels, kernel 1506-2 and kernel 1506-3. Kernel 1506-2 on FPGA 1512-1 is also assigned to composite node 1534-1, while kernel 1506-3 is not.

Composite node 1534-2 includes processor 1530-2 running application 1532-2 on compute sled 1526-2. Compute sled 1526-2 connects to fabric 1570 via FA 1518-4. Note that compute sleds 1526 may also include a number of processors, memory, and other local resources that may be communicatively coupled to one another via a passive backplane, and share a common FA 1518. Composite node 1534-2 also includes kernel 1506-3 running on shared FPGA 1512-2, and having access to shared resource 1508-2. Composite node 1534-2 may store data on storage block 1524-2.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present specification.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

In the foregoing description, certain aspects of some or all embodiments are described in greater detail than is strictly necessary for practicing the appended claims. These details are provided by way of nonlimiting example only, for the purpose of providing context and illustration of the disclosed embodiments. Such details should not be understood to be required, and should not be "read into" the claims as limitations. The phrase may refer to "an embodiment" or "embodiments." These phrases, and any other references to embodiments, should be understood broadly to refer to any combination of one or more embodiments. Furthermore, the several features disclosed in a particular "embodiment" could just as well be spread across multiple embodiments. For example, if features 1 and 2 are disclosed in "an embodiment," embodiment A may have feature 1 but lack feature 2, while embodiment B may have feature 2 but lack feature 1.

This specification may provide illustrations in a block diagram format, wherein certain features are disclosed in separate blocks. These should be understood broadly to disclose how various features interoperate, but are not intended to imply that those features must necessarily be embodied in separate hardware or software. Furthermore, where a single block discloses more than one feature in the same block, those features need not necessarily be embodied in the same hardware and/or software. For example, a computer "memory" could in some circumstances be distributed or mapped between multiple levels of cache or local memory, main memory, battery-backed volatile memory, and various forms of persistent memory such as a hard disk, storage server, optical disk, tape drive, or similar. In certain embodiments, some of the components may be omitted or consolidated. In a general sense, the arrangements depicted in the FIGURES may be more logical in their representations, whereas a physical architecture may include various permutations, combinations, and/or hybrids of these elements. Countless possible design configurations can be used to achieve the operational objectives outlined herein. Accordingly, the associated infrastructure has a myriad of substitute arrangements, design choices, device possibilities, hardware configurations, software implementations, and equipment options.

References may be made herein to a computer-readable medium, which may be a tangible and non-transitory computer-readable medium. As used in this specification and throughout the claims, a "computer-readable medium" should be understood to include one or more computer-readable mediums of the same or different types. A computer-readable medium may include, by way of nonlimiting example, an optical drive (e.g., CD/DVD/Blu-Ray), a hard drive, a solid state drive, a flash memory, or other nonvolatile medium. A computer-readable medium could also include a medium such as a ROM, an FPGA or ASIC configured to carry out the desired instructions, stored instructions for programming an FPGA or ASIC to carry out the desired instructions, an IP block that can be integrated in hardware into other circuits, or instructions encoded directly into hardware or microcode on a processor such as a microprocessor, DSP, microcontroller, or in any other suitable component, device, element, or object where appropriate and based on particular needs. A non-transitory storage medium herein is expressly intended to include any non-transitory special-purpose or programmable hardware configured to provide the disclosed operations, or to cause a processor to perform the disclosed operations.

Various elements may be "communicatively," "electrically," "mechanically," or otherwise "coupled" to one another throughout this specification and the claims. Such coupling may be a direct, point-to-point coupling, or may include intermediary devices. For example, two devices may be communicatively coupled to one another via a controller that facilitates the communication. Devices may be electrically coupled to one another via intermediary devices such as signal boosters, voltage dividers, or buffers. Mechanically coupled devices may be indirectly mechanically coupled.

Any "module" or "engine" disclosed herein may refer to or include software, a software stack, a combination of hardware, firmware, and/or software, a circuit configured to carry out the function of the engine or module, or any computer-readable medium as disclosed above. Such modules or engines may, in appropriate circumstances, be provided on or in conjunction with a hardware platform, which may include hardware compute resources such as a processor, memory, storage, interconnects, networks and network interfaces, accelerators, or other suitable hardware. Such a hardware platform may be provided as a single monolithic device (e.g., in a PC form factor), or with some or part of the function being distributed (e.g., a "composite node" in a high-end data center, where compute, memory, storage, and other resources may be dynamically allocated and need not be local to one another).

There may be disclosed herein flow charts, signal flow diagram, or other illustrations showing operations being performed in a particular order. Unless otherwise expressly noted, or unless required in a particular context, the order should be understood to be a nonlimiting example only. Furthermore, in cases where one operation is shown to follow another, other intervening operations may also occur, which may be related or unrelated. Some operations may also be performed simultaneously or in parallel. In cases where an operation is said to be "based on" or "according to" another item or operation, this should be understood to imply that the operation is based at least partly on or according at least partly to the other item or operation. This should not be construed to imply that the operation is based solely or exclusively on, or solely or exclusively according to the item or operation.

All or part of any hardware element disclosed herein may readily be provided in an SoC, including a CPU package. An SoC represents an integrated circuit (IC) that integrates components of a computer or other electronic system into a single chip. Thus, for example, client devices or server devices may be provided, in whole or in part, in an SoC. The SoC may contain digital, analog, mixed-signal, and radio frequency functions, all of which may be provided on a single chip substrate. Other embodiments may include a multichip module (MCM), with a plurality of chips located within a single electronic package and configured to interact closely with each other through the electronic package.

In a general sense, any suitably-configured circuit or processor can execute any type of instructions associated with the data to achieve the operations detailed herein. Any processor disclosed herein could transform an element or an article (for example, data) from one state or thing to another state or thing. Furthermore, the information being tracked, sent, received, or stored in a processor could be provided in any database, register, table, cache, queue, control list, or storage structure, based on particular needs and implementations, all of which could be referenced in any suitable timeframe. Any of the memory or storage elements disclosed herein, should be construed as being encompassed within the broad terms "memory" and "storage," as appropriate.

Computer program logic implementing all or part of the functionality described herein is embodied in various forms, including, but in no way limited to, a source code form, a computer executable form, machine instructions or microcode, programmable hardware, and various intermediate forms (for example, forms generated by an assembler, compiler, linker, or locator). In an example, source code includes a series of computer program instructions implemented in various programming languages, such as an object code, an assembly language, or a high-level language such as OpenCL, FORTRAN, C, C++, JAVA, or HTML for use with various operating systems or operating environments, or in hardware description languages such as Spice, Verilog, and VHDL. The source code may define and use various data structures and communication messages. The source code may be in a computer executable form (e.g., via an interpreter), or the source code may be converted (e.g., via a translator, assembler, or compiler) into a computer executable form, or converted to an intermediate form such as byte code. Where appropriate, any of the foregoing may be used to build or describe appropriate discrete or integrated circuits, whether sequential, combinatorial, state machines, or otherwise.

In one example embodiment, any number of electrical circuits of the FIGURES may be implemented on a board of an associated electronic device. The board can be a general circuit board that can hold various components of the internal electronic system of the electronic device and, further, provide connectors for other peripherals. Any suitable processor and memory can be suitably coupled to the board based on particular configuration needs, processing demands, and computing designs. Note that with the numerous examples provided herein, interaction may be described in terms of two, three, four, or more electrical components. However, this has been done for purposes of clarity and example only. It should be appreciated that the system can be consolidated or reconfigured in any suitable manner. Along similar design alternatives, any of the illustrated components, modules, and elements of the FIGURES may be combined in various possible configurations, all of which are within the broad scope of this specification.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 (pre-AIA) or paragraph (f) of the same section (post-AIA), as it exists on the date of the filing hereof unless the words "means for" or "steps for" are specifically used in the particular claims; and (b) does not intend, by any statement in the specification, to limit this disclosure in any way that is not otherwise expressly reflected in the appended claims.

EXAMPLE IMPLEMENTATIONS

The following examples are provided by way of illustration.

Example 1 includes a computing apparatus, comprising: a processor; a multilevel cache comprising a plurality of cache levels; a peripheral device configured to write data directly to a directly writable cache; and a cache monitoring circuit, comprising cache counters La to be incremented when a cache line is allocated into the directly writable cache, Lp to be incremented when a cache line is processed by the processor and deallocated from the directly writable cache, Le to be incremented when a cache line is evicted from the directly writable cache to the memory, wherein the cache monitoring circuit is to determine a direct write policy according to the cache counters.

Example 2 includes the computing apparatus of example 1, wherein Le is to be incremented only when the cache line is evicted without having been retrieved by the processor.

Example 3 includes the computing apparatus of example 1, wherein the directly writable cache is last-level cache.

Example 4 includes the computing apparatus of example 1, wherein the multilevel cache is a non-inclusive cache.

Example 5 includes the computing apparatus of example 1, wherein the cache counters are sampling counters configured to sample fewer than all cache sets.

Example 6 includes the computing apparatus of example 5, wherein the cache counters are configured to sample approximately 2% of all cache sets.

Example 7 includes the computing apparatus of example 6, wherein the cache monitoring circuit is further to reset La, Lp, and Le after a policy window.

Example 8 includes the computing apparatus of example 6, wherein the cache monitoring circuit is to allocate all transactions on the sampled sets to the directly writable cache.

Example 9 includes the computing apparatus of example 7, wherein the cache monitoring circuit is to allocate interstitial cache transactions according to policy.

Example 10 includes the computing apparatus of example 1, wherein determining the direct write policy comprises determining that Lp is approximately equal to La and that Le is at or near zero, determining that the cache is not over-utilized, and determining a direct write policy to write incoming data to the directly writable cache.

Example 11 includes the computing apparatus of example 1, wherein determining the direct policy comprises determining that Lp is substantially smaller than La and that Le is substantially nonzero, determining that the cache is over-utilized, and determining a direct write policy to write incoming data directly to memory.

Example 12 includes the computing apparatus of example 1, wherein the peripheral device is an Ethernet network interface.

Example 13 includes the computing apparatus of example 1, wherein the peripheral device is a cache-coherent core-to-core network interface.

Example 14 includes the computing apparatus of example 13, wherein the cache-coherent core-to-core network interface is Omni-Path or a derivative of Omni-Path.

Example 15 includes the computing apparatus of example 1, wherein the peripheral device is a cache-coherent core-to-core network interface over a peripheral component interconnect express (PCIe) interconnect.

Example 16 includes a shared resource monitor, comprising: an interface to communicatively couple to a core; an interface to communicatively couple to a cache; an interface to communicatively couple to a peripheral device; a cache counter La to be incremented when a cache line is allocated into the cache; a cache counter Lp to be incremented when a cache line is processed by the core and deallocated from the cache; a cache counter Le to be incremented when a cache line is evicted from the directly writable cache to the memory; and a policy circuit to determine a direct write policy according to the cache counters.

Example 17 includes the shared resource monitor of example 16, wherein the cache is a directly writable cache of a multilevel cache.

Example 18 includes the shared resource monitor of example 17, wherein the directly writable cache is last-level cache.

Example 19 includes the shared resource monitor of example 17, wherein the multilevel cache is a non-inclusive cache.

Example 20 includes the shared resource monitor of example 16, wherein Le is to be incremented only when the cache line is evicted without having been retrieved by the core.

Example 21 includes the shared resource monitor of example 16, wherein the cache counters are sampling counters configured to sample fewer than all cache transactions.

Example 22 includes the shared resource monitor of example 21, wherein the cache counters are configured to sample approximately 2% of all cache transactions.

Example 23 includes the shared resource monitor of example 21, wherein the policy circuit resets La, Lp, and Le after a policy window.

Example 24 includes the shared resource monitor of example 21, wherein the cache monitoring circuit is to allocate all sampled transactions directly to the cache.

Example 25 includes the shared resource monitor of example 24, wherein the cache monitoring circuit is to allocate interstitial cache transactions according to policy.

Example 26 includes the shared resource monitor of example 16, wherein determining the direct write policy comprises determining that Lp is approximately equal to La and that Le is at or near zero, determining that the cache is not over-utilized, and determining a direct write policy to write incoming data to the directly writable cache.

Example 27 includes the shared resource monitor of example 16, wherein determining the direct policy comprises determining that Lp is substantially smaller than La and that Le is substantially nonzero, determining that the cache is over-utilized, and determining a direct write policy to write incoming data directly to memory.

Example 28 includes the shared resource monitor of example 16, wherein the peripheral device is an Ethernet network interface.

Example 29 includes the shared resource monitor of example 16, wherein the peripheral device is a cache-coherent core-to-core network interface.

Example 30 includes the shared resource monitor of example 29, wherein the cache-coherent core-to-core network interface is Omni-Path or a derivative of Omni-Path.

Example 31 includes the shared resource monitor of example 16, wherein the peripheral device is a cache-coherent core-to-core network interface over a peripheral component interconnect express (PCIe) interconnect.

Example 32 includes an intellectual property (IP) block comprising the shared resource monitor of any of examples 1-31.

Example 33 includes a field-programmable gate array (FPGA) comprising the shared resource monitor of any of examples 1-31.

Example 34 includes an integrated circuit (IC) comprising the shared resource monitor of any of examples 1-31.

Example 35 includes a microprocessor comprising the IC of example 34.

Example 36 includes a system-on-a-chip (SoC) comprising the microprocessor of example 35.

Example 37 includes a computer-implemented method of providing device direct input/output (DDIO), comprising: communicatively coupling to a shared last-level cache (LLC), the LLC shared by a plurality of cores; communicatively coupling to a peripheral device; incrementing a cache counter La when a cache line is allocated into the LLC; incrementing a cache counter Lp when a cache line is processed by the core and deallocated from the cache; incrementing a cache counter Le when a cache line is evicted from the directly writable cache to the memory; and setting a direct write policy for the LLC according to the cache counters.

Example 38 includes the method of example 37, wherein the LLC is a member of a non-inclusive cache.

Example 39 includes the method of example 37, further comprising incrementing Le only when the cache line is evicted without having been retrieved by the core.

Example 40 includes the method of example 37, further comprising incrementing the cache counters according to a sampling algorithm, comprising sampling fewer than all cache transactions.

Example 41 includes the method of example 40, further comprising sampling approximately 2% of all cache transactions.

Example 42 includes the method of example 37, further comprising resetting La, Lp, and Le after a policy window.

Example 43 includes the method of example 37, wherein the cache monitoring circuit is to allocate all sampled transactions directly to the cache.

Example 44 includes the shared resource monitor of example 24, further comprising allocating interstitial cache transactions according to policy.

Example 45 includes the method of example 37, wherein determining the direct write policy comprises determining that Lp is approximately equal to La and that Le is at or near zero, determining that the cache is not over-utilized, and determining a direct write policy to write incoming data to the directly writable cache.

Example 46 includes the method of example 37, wherein determining the direct policy comprises determining that Lp is substantially smaller than La and that Le is substantially nonzero, determining that the cache is over-utilized, and determining a direct write policy to write incoming data directly to memory.

Example 47 includes the method of example 37, wherein the peripheral device is an Ethernet network interface.

Example 48 includes the method of example 37, wherein the peripheral device is a cache-coherent core-to-core network interface.

Example 49 includes the method of example 48, wherein the cache-coherent core-to-core network interface is Omni-Path or a derivative of Omni-Path.

Example 50 includes the method of example 37, wherein the peripheral device is a cache-coherent core-to-core network interface over a peripheral component interconnect express (PCIe) interconnect.

Example 51 includes an apparatus comprising means for performing the method of any of examples 37-50.

Example 52 includes the apparatus of example 51, wherein the means comprise a computing system.

Example 53 includes the apparatus of example 52, wherein the computing system comprises a central processor unit (CPU) comprising a plurality of cores and a shared resource monitor.

Example 54 includes a shared resource monitor comprising circuitry to perform the method of any of examples 37-50.

Example 55 includes an intellectual property (IP) block comprising the shared resource monitor of example 54.

Example 56 includes a field-programmable gate array (FPGA) comprising the shared resource monitor of example 54.

Example 57 includes an integrated circuit (IC) comprising the shared resource monitor of example 54.

Example 58 includes a microprocessor comprising the IC of example 57.

Example 59 includes a system-on-a-chip (SoC) comprising the microprocessor of example 58.

Example 60 includes one or more tangible, non-transitory computer-readable mediums having stored thereon instructions to cause an apparatus to provide a shared resource monitor comprising: an interface to communicatively couple to a core; an interface to communicatively couple to a cache; an interface to communicatively couple to a peripheral device; a cache counter La to be incremented when a cache line is allocated into the cache; a cache counter Lp to be incremented when a cache line is processed by the core and deallocated from the cache; a cache counter Le to be incremented when a cache line is evicted from the directly writable cache to the memory; and a policy circuit to determine a direct write policy according to the cache counters.

Example 61 includes one or more tangible, non-transitory computer-readable mediums of example 60, wherein the cache is a directly writable cache of a multilevel cache.

Example 62 includes one or more tangible, non-transitory computer-readable mediums of example 61, wherein the directly writable cache is last-level cache.

Example 63 includes one or more tangible, non-transitory computer-readable mediums of example 61, wherein the multilevel cache is a non-inclusive cache.

Example 64 includes one or more tangible, non-transitory computer-readable mediums of example 60, wherein Le is to be incremented only when the cache line is evicted without having been retrieved by the core.

Example 65 includes one or more tangible, non-transitory computer-readable mediums of example 60, wherein the cache counters are sampling counters configured to sample fewer than all cache sets.

Example 66 includes one or more tangible, non-transitory computer-readable mediums of example 65, wherein the cache counters are configured to sample approximately 2% of all cache sets.

Example 67 includes one or more tangible, non-transitory computer-readable mediums of example 65, wherein the policy circuit resets La, Lp, and Le after a policy window.

Example 68 includes one or more tangible, non-transitory computer-readable mediums of example 65, wherein the cache monitoring circuit is to allocate all sampled transactions directly to the cache.

Example 69 includes one or more tangible, non-transitory computer-readable mediums of example 68, wherein the cache monitoring circuit is to allocate interstitial cache transactions according to policy.

Example 70 includes one or more tangible, non-transitory computer-readable mediums of example 60, wherein determining the direct write policy comprises determining that Lp is approximately equal to La and that Le is at or near zero, determining that the cache is not over-utilized, and determining a direct write policy to write incoming data to the directly writable cache.

Example 71 includes one or more tangible, non-transitory computer-readable mediums of example 60, wherein determining the direct policy comprises determining that Lp is substantially smaller than La and that Le is substantially nonzero, determining that the cache is over-utilized, and determining a direct write policy to write incoming data directly to memory.

Example 72 includes one or more tangible, non-transitory computer-readable mediums of example 60, wherein the peripheral device is an Ethernet network interface.

Example 73 includes one or more tangible, non-transitory computer-readable mediums of example 60, wherein the peripheral device is a cache-coherent core-to-core network interface.

Example 74 includes one or more tangible, non-transitory computer-readable mediums of example 73, wherein the cache-coherent core-to-core network interface is Omni-Path or a derivative of Omni-Path.

Example 75 includes one or more tangible, non-transitory computer-readable mediums of example 60, wherein the peripheral device is a cache-coherent core-to-core network interface over a peripheral component interconnect express (PCIe) interconnect.

Example 76 includes one or more tangible, non-transitory computer-readable mediums of any of examples 60-75, wherein the instructions comprise instructions to program an intellectual property (IP) block.

Example 77 includes one or more tangible, non-transitory computer-readable mediums of any of examples 60-75, wherein the instructions comprise instructions to program a field-programmable gate array (FPGA).

Example 78 includes one or more tangible, non-transitory computer-readable mediums of any of examples 60-75, wherein the instructions comprise instructions to program an integrated circuit (IC).

Example 79 includes one or more tangible, non-transitory computer-readable mediums of example 78, wherein the IC comprises a processor.

Example 80 includes one or more tangible, non-transitory computer-readable mediums of any of examples 60-75, wherein the instructions comprise instructions to program a system-on-a-chip (SoC).

Example 81 includes a computing apparatus, comprising: a processor; a multilevel cache comprising a plurality of cache levels; a peripheral device configured to write data directly to a selected cache level; and a cache monitoring circuit, comprising a cache counter to track cache lines evicted from the selected cache level without being processed; and logic to provide a direct write policy according to the cache counter.

Example 82 includes the computing apparatus of example 81, wherein the selected cache level is a last-level cache.

Example 83 includes the computing apparatus of example 81, wherein the selected cache level is a directly-writable cache.

Example 84 includes the computing apparatus of example 81, wherein the multilevel cache is a non-inclusive cache.

Example 85 includes the computing apparatus of example 81, wherein the cache counter is a sampling counter configured to sample fewer than all cache sets.

Example 86 includes the computing apparatus of example 85, wherein the cache counter is configured to sample approximately 2% of all cache sets.

Example 87 includes the computing apparatus of example 86, wherein the cache monitoring circuit is further to reset the cache counter after a policy window.

Example 88 includes the computing apparatus of example 87, wherein the cache monitoring circuit is to allocate all transactions on the sampled sets to the selected cache level.

Example 89 includes the computing apparatus of example 88, wherein the cache monitoring circuit is to allocate interstitial cache transactions according to policy.

Example 90 includes the computing apparatus of example 89, wherein the cache counter is a first cache counter, and further comprising a second cache counter to be incremented when a cache line is allocated into the selected cache level, and a third cache counter to be incremented when a cache line is processed by the processor.

Example 91 includes the computing apparatus of example 90, wherein determining the direct write policy comprises determining that the second cache counter is approximately equal to the third cache counter, and that the first cache counter is at or near zero, determining that the multilevel cache is not over-utilized, and determining a direct write policy to write incoming data to the selected cache level.

Example 92 includes the computing apparatus of example 90, wherein determining the direct write policy comprises determining that the third cache counter is substantially smaller than the second cache counter and that the first cache counter is substantially nonzero, determining that the multilevel cache is over-utilized, and determining a direct write policy to write incoming data directly to memory.

Example 93 includes the computing apparatus of example 81, wherein the peripheral device is an Ethernet network interface.

Example 94 includes the computing apparatus of example 81, wherein the peripheral device is a cache-coherent core-to-core network interface.

Example 95 includes the computing apparatus of example 94, wherein the cache-coherent core-to-core network interface is Omni-Path or a derivative of Omni-Path.

Example 96 includes the computing apparatus of example 81, wherein the peripheral device is a cache-coherent core-to-core network interface over a peripheral component interconnect express (PCIe) interconnect.

Example 97 includes a shared resource monitor, comprising: an interface to communicatively couple to a core; an interface to communicatively couple to a cache; an interface to communicatively couple to a peripheral device; a cache counter to be incremented when a cache line is evicted from a directly writable cache to a memory without being processed; and a policy circuit to determine a direct write policy according to the cache counter.

Example 98 includes the shared resource monitor of example 97, wherein the cache is a directly writable cache of a multi-level cache.

Example 99 includes a computer-implemented method of providing device direct input/output (DDIO), comprising: communicatively coupling to a shared last-level cache (LLC), the LLC shared by a plurality of cores; communicatively coupling to a peripheral device; incrementing a cache counter when a cache line is evicted from a directly writable cache to a memory without being processed; and setting a direct write policy for the LLC according to the cache counter.

Example 100 includes the method of example 99, wherein the LLC is a member of a non-inclusive cache.

What is claimed is:

1. An apparatus, comprising:
   a processor;
   a multilevel cache for use by the processor to process data, the multilevel cache to include a last-level-cache (LLC) for which a peripheral device is able to directly write data to the LLC; and
   circuitry to:
   monitor cache lines maintained in the LLC to detect whether at least one cache line was evicted from the LLC prior to being processed by the processor; and
   adjust a direct write policy to control the ability of the peripheral device to directly write data to the LLC based on whether at least one cache line was detected as being evicted from the LLC prior to being processed by the processor while the cache lines are monitored.

2. The apparatus of claim 1, further comprising the circuitry to:
   use a cache counter to track individual cache line evictions from among the detected at least one cache line that was evicted from the LLC prior to being processed by the processor while the cache lines are monitored.

3. The apparatus of claim 1, wherein the multilevel cache is a non-inclusive cache.

4. The apparatus of claim 2, wherein the cache counter is a sampling counter configured to sample fewer than all cache lines maintained in the LLC.

5. The apparatus of claim 4, wherein the sampling counter is configured to sample approximately 2% of all cache lines maintained in the LLC.

6. The apparatus of claim 2 further comprising the circuitry to reset the cache counter after a policy monitoring window.

7. The apparatus of claim 2, the cache counter used by the circuitry to track individual cache line evictions comprises a first cache counter, wherein the circuitry is further to:
   use a second cache counter, the second cache counter to be incremented when a cache line is allocated to the LLC; and use a third cache counter, the third cache counter to be incremented when a cache line maintained in the LLC is processed by the processor.

8. The apparatus of claim 7, the circuitry to adjust the direct write policy comprises the circuitry to:
determine that the second cache counter is approximately equal to the third cache counter, and that the first cache counter is at or near zero;
determine that the multilevel cache is not over-utilized; and
determine to adjust the direct write policy to allow the peripheral device to directly write data to the LLC.

9. The apparatus of claim 7, the circuitry to adjust the direct write policy comprises the circuitry to:
determine that the third cache counter is substantially smaller than the second cache counter and that the first cache counter is substantially nonzero;
determine that the multilevel cache is over-utilized; and
determine to adjust the direct write policy to restrict the peripheral device to directly write data to the LLC.

10. The apparatus of claim 1, wherein the peripheral device is an Ethernet network interface.

11. The apparatus of claim 1, wherein the peripheral device is a cache-coherent core-to-core network interface.

12. The apparatus of claim 11, wherein the cache-coherent core-to-core network interface is Omni-Path or a derivative of Omni-Path.

13. The apparatus of claim 1, wherein the peripheral device is a cache-coherent core-to-core network interface over a peripheral component interconnect express (PCIe) interconnect.

14. A method comprising:
communicatively coupling to a last-level cache (LLC), the LLC shared by a plurality of cores of a multicore processor of a computing system, the LLC used by the plurality of cores to process data;
communicatively coupling to a peripheral device of the computing system, the peripheral device is able to directly write data to the LLC;
monitoring cache lines maintained in the LLC to detect whether at least one cache line was evicted from the LLC prior to being processed by at least one core from among the plurality of core; and
adjusting a direct write policy to control the ability of the peripheral device to directly write data to the LLC based on whether at least one cache line was detected as being evicted from the LLC prior to being processed by the at least one core while the cache lines are monitored.

15. The method of claim 14, wherein the LLC is a member of a non-inclusive cache.

16. At least one non-transitory computer-readable storage medium, comprising a plurality of instructions, that when executed by a system, cause the system to:
communicatively couple to a last-level cache (LLC), the LLC shared by a plurality of cores of a multicore processor of a computing system, the LLC used by the plurality of cores to process data;
communicatively couple to a peripheral device of the computing system, the peripheral device is able to directly write data to the LLC;
monitor cache lines maintained in the LLC to detect whether at least one cache line was evicted from the LLC prior to being processed by at least one core from among the plurality of core; and
adjust a direct write policy to control the ability of the peripheral device to directly write data to the LLC based on whether at least one cache line was detected as being evicted from the LLC prior to being processed by the at least one core while the cache lines are monitored.

17. The at least one non-transitory computer-readable storage medium of claim 16, the instructions to further cause the system to:
use a cache counter to track individual cache line evictions from among the detected at least one cache line that was evicted from the LLC prior to being processed by at least one core from among the plurality of cores while the cache lines are monitored.

18. The at least one non-transitory computer-readable storage medium of claim 17, the cache counter used to track individual cache line evictions comprises a first cache counter, wherein the instructions are to further cause the system to:
use a second cache counter, the second cache counter to be incremented when a cache line is allocated to the LLC; and
use a third cache counter, the third cache counter to be incremented when a cache line maintained in the LLC is processed by at least one core from among the plurality of cores.

19. The at least one non-transitory computer-readable storage medium of claim 18, the instructions to cause the system to adjust the direct write policy comprises the instructions to cause the system to:
determine that the second cache counter is approximately equal to the third cache counter, and that the first cache counter is at or near zero;
determine that the LLC is not over-utilized; and
determine to adjust the direct write policy to allow the peripheral device to directly write data to the LLC.

20. The at least one non-transitory computer-readable storage medium of claim 18, the instructions to cause the system to adjust the direct write policy comprises the instructions to cause the system to:
determine that the third cache counter is substantially smaller than the second cache counter and that the first cache counter is substantially nonzero;
determine that the LLC is over-utilized; and
determine to adjust the direct write policy to restrict the peripheral device to directly write data to the LLC.

21. The at least one non-transitory computer-readable storage medium of claim 16, wherein the peripheral device is an Ethernet network interface.

* * * * *